United States Patent [19]

Gilbert et al.

[11] Patent Number: 4,551,746
[45] Date of Patent: Nov. 5, 1985

[54] LEADLESS CHIP CARRIER APPARATUS PROVIDING AN IMPROVED TRANSMISSION LINE ENVIRONMENT AND IMPROVED HEAT DISSIPATION

[75] Inventors: Barry K. Gilbert; Daniel J. Schwab, both of Rochester, Minn.

[73] Assignee: Mayo Foundation, Rochester, Minn.

[21] Appl. No.: 505,866

[22] Filed: Jun. 20, 1983

Related U.S. Application Data

[63] Continuation-in-part of Ser. No. 432,843, Oct. 5, 1982.

[51] Int. Cl.⁴ .................... H01L 23/14; H01L 23/40; H01L 23/48; H01L 23/04
[52] U.S. Cl. ........................................ 357/74; 357/81; 357/68; 357/80; 361/414
[58] Field of Search ........................ 357/74, 81, 70, 80; 361/414

[56] References Cited

U.S. PATENT DOCUMENTS

| | | | |
|---|---|---|---|
| Re. 30,604 | 5/1981 | Kowalski . | |
| 3,157,857 | 11/1964 | Stapper, Jr. et al. | 361/414 X |
| 3,312,878 | 4/1967 | Poch et al. | 361/414 X |
| 3,617,817 | 11/1971 | Kawakatsu et al. | 357/74 X |
| 3,777,221 | 12/1973 | Tatusko et al. | 361/414 |
| 3,895,435 | 7/1975 | Turner et al. | 361/414 |
| 3,905,038 | 9/1975 | Beyerlein . | |
| 3,943,556 | 3/1976 | Wilson . | |
| 4,007,479 | 2/1977 | Kowalski . | |
| 4,023,053 | 5/1977 | Shimizu et al. | 357/70 |
| 4,028,722 | 6/1977 | Helda . | |
| 4,054,939 | 10/1977 | Ammon | 361/414 |
| 4,067,041 | 1/1978 | Hutson . | |
| 4,099,200 | 7/1978 | Koutalides . | |
| 4,109,096 | 8/1978 | Dehaine . | |
| 4,112,196 | 9/1978 | Selig et al. . | |
| 4,204,218 | 5/1980 | Fox et al. . | |
| 4,250,520 | 2/1981 | Denlinger . | |
| 4,257,061 | 3/1981 | Chapel et al. . | |
| 4,288,841 | 9/1981 | Gogal | 357/74 X |
| 4,322,778 | 3/1982 | Barbour et al. | 361/414 |
| 4,323,914 | 4/1982 | Berndlmaier et al. . | |
| 4,329,642 | 6/1982 | Luthi et al. . | |
| 4,332,341 | 6/1982 | Minetti . | |
| 4,338,621 | 7/1982 | Braun | 357/74 |
| 4,366,342 | 1/1983 | Demnianiuk . | |
| 4,368,503 | 1/1983 | Kurosawa et al. | 361/414 |
| 4,381,131 | 14/1983 | Breedlove . | |
| 4,453,176 | 1/1984 | Chance et al. | 357/68 |

OTHER PUBLICATIONS

Brochure entitled, "Kyocera Packaging", Catalog No. 15T7908 Ft, published by Kyocera International, Inc.
Publication, "Joint Electron Device Engineering Counsel" (JEDEC) 95, Section 9.4, pp. 9.452–9.457 dated Oct. 6, 1980.

*Primary Examiner*—Andrew J. James
*Assistant Examiner*—Sheila V. Clark
*Attorney, Agent, or Firm*—Merchant, Gould, Smith, Edell, Welter & Schmidt

[57] ABSTRACT

A carrier apparatus (40) for mounting logic components on the surface of a circuit board (41). The carrier apparatus (40) includes a housing structure defining top and bottom surfaces and further defining a cavity (50) in the bottom surface for receipt of a logic component (51). A recessed cover portion (56) is attached to the housing so as to enclose the cavity (50) thereby effectively sealing the logic component (51) in the housing. The carrier apparatus (40) includes means for mounting the housing on a circuit board such that the cover (56) does not make contact with the surface of the circuit board (41). The housing further includes means for electrically interconnecting the logic component (51) to the circuit board (41).

In yet another embodiment, a carrier apparatus (100) for mounting logic components on the surface of a circuit board (41) is disclosed which utilize ground and voltage planes together with alternating signal (118) and AC ground (121) traces so as to effectuate coplanar/stripline and coplanar/microstrip transmission line environments along portions of the signal traces (118). Consequently, this results in signal lines having a controlled impedance environment and minimized crosstalk between neighboring signal leads lying in the same plane.

21 Claims, 46 Drawing Figures

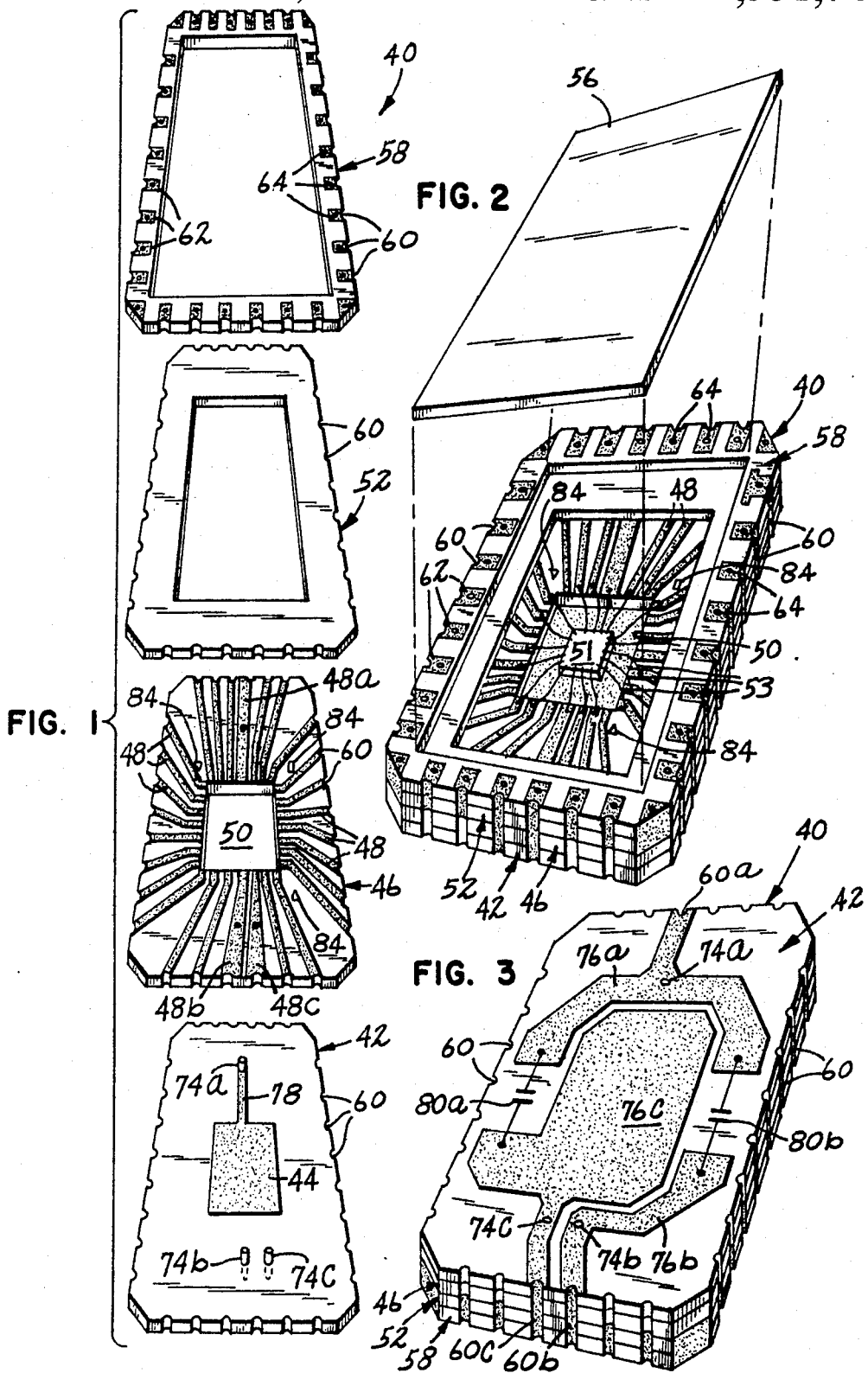

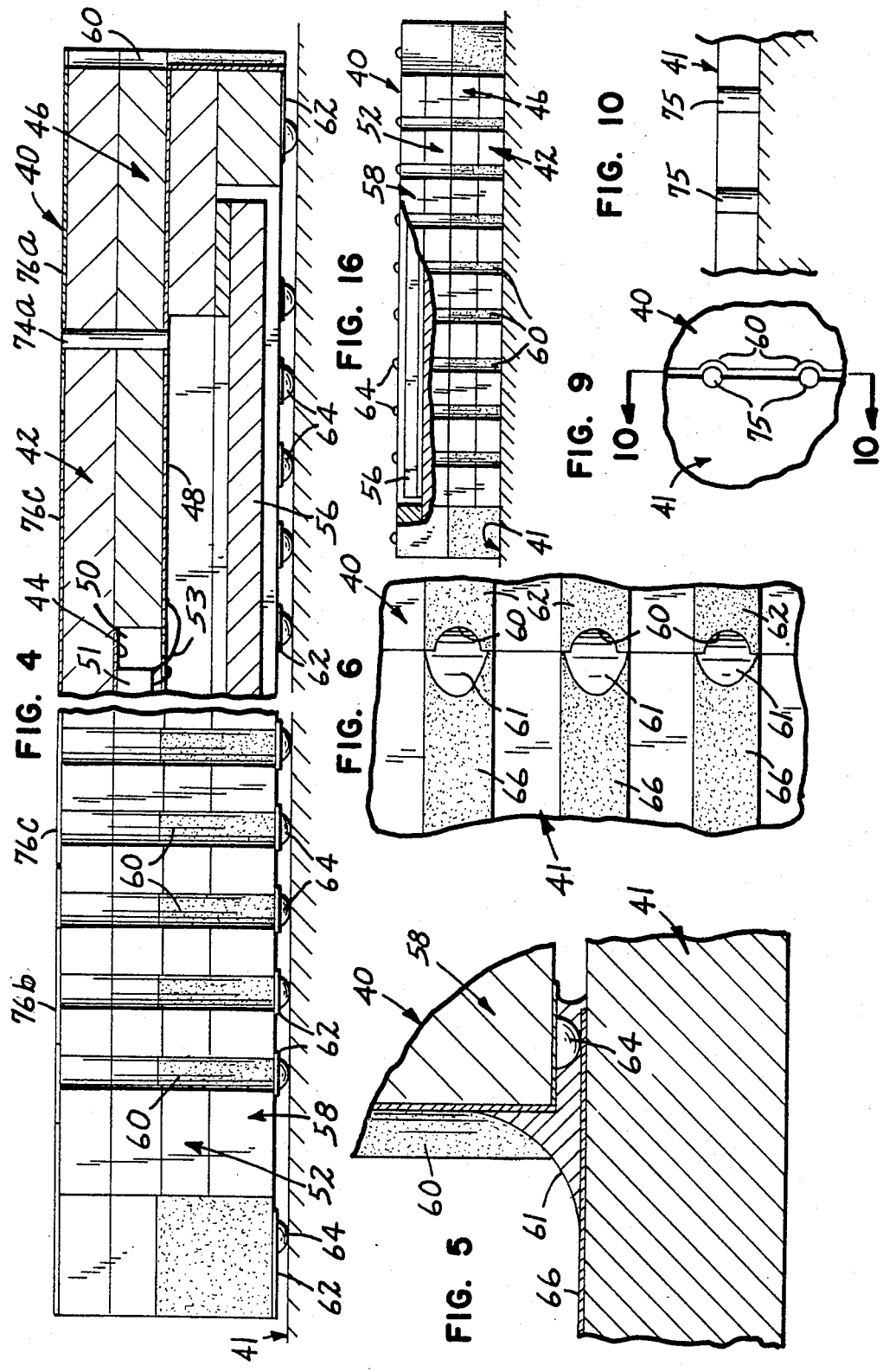

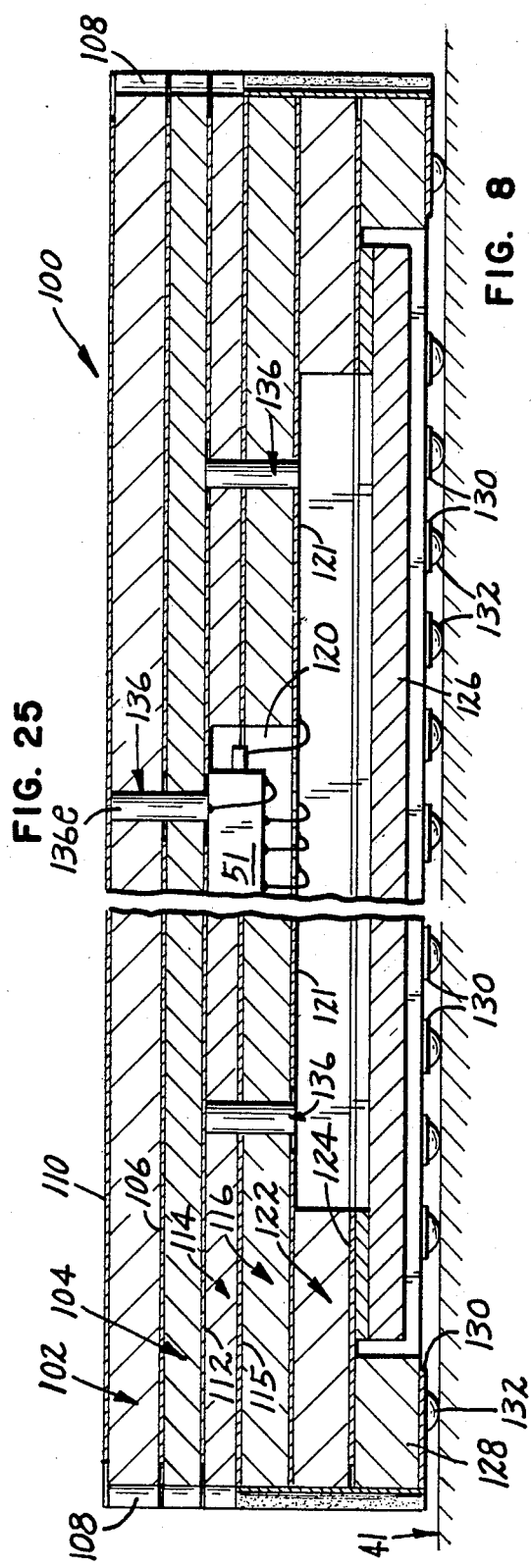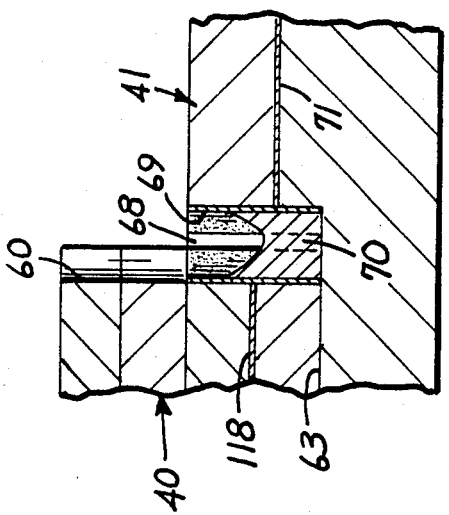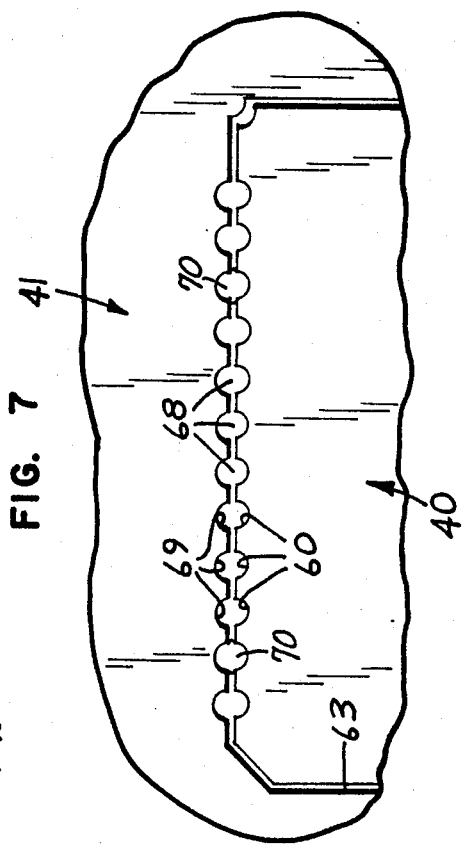

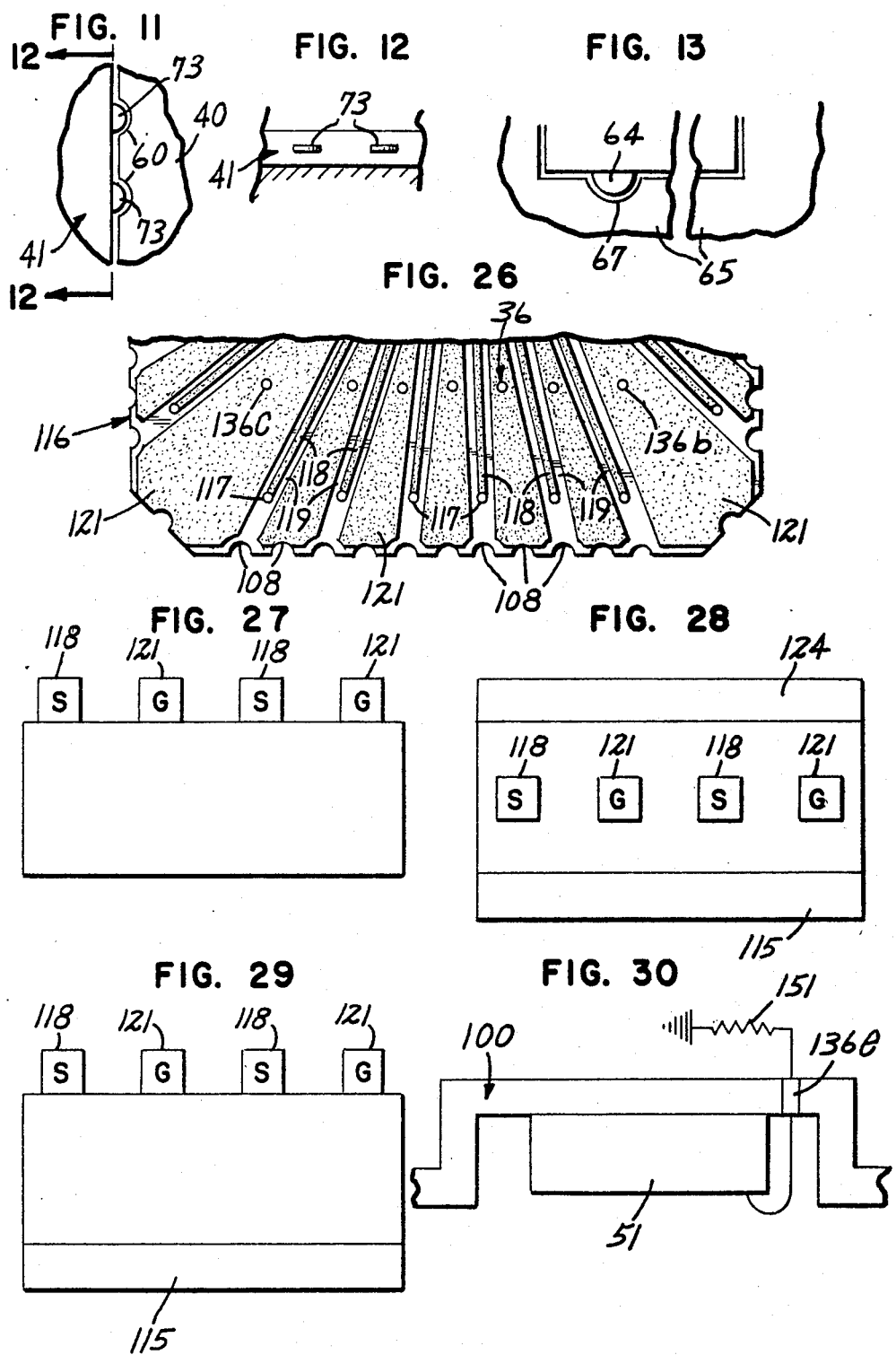

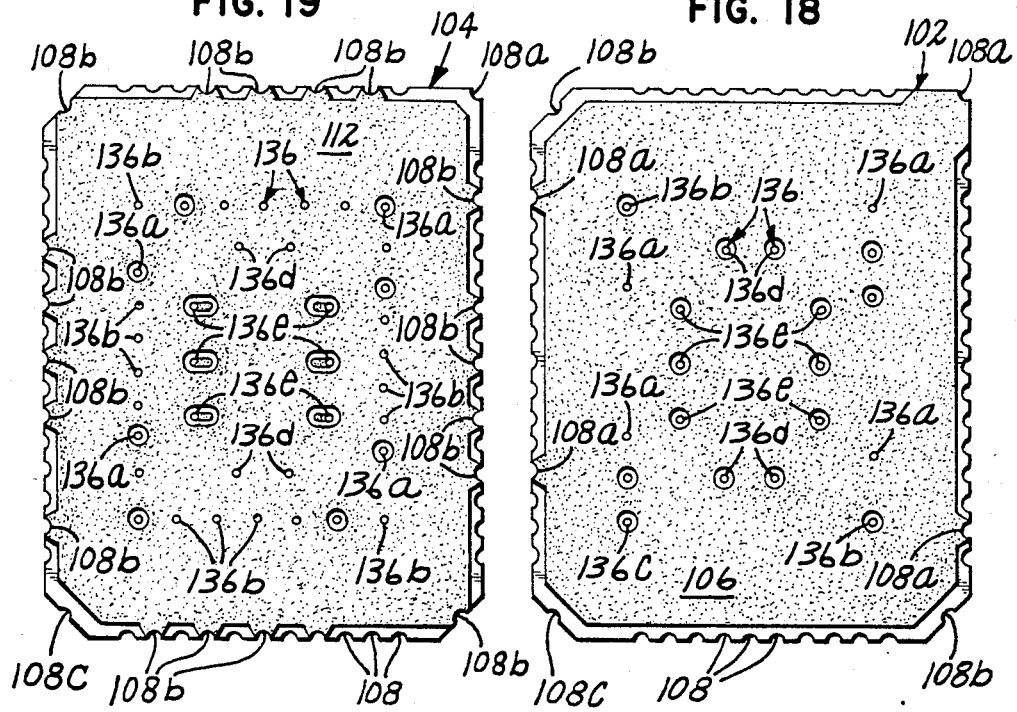

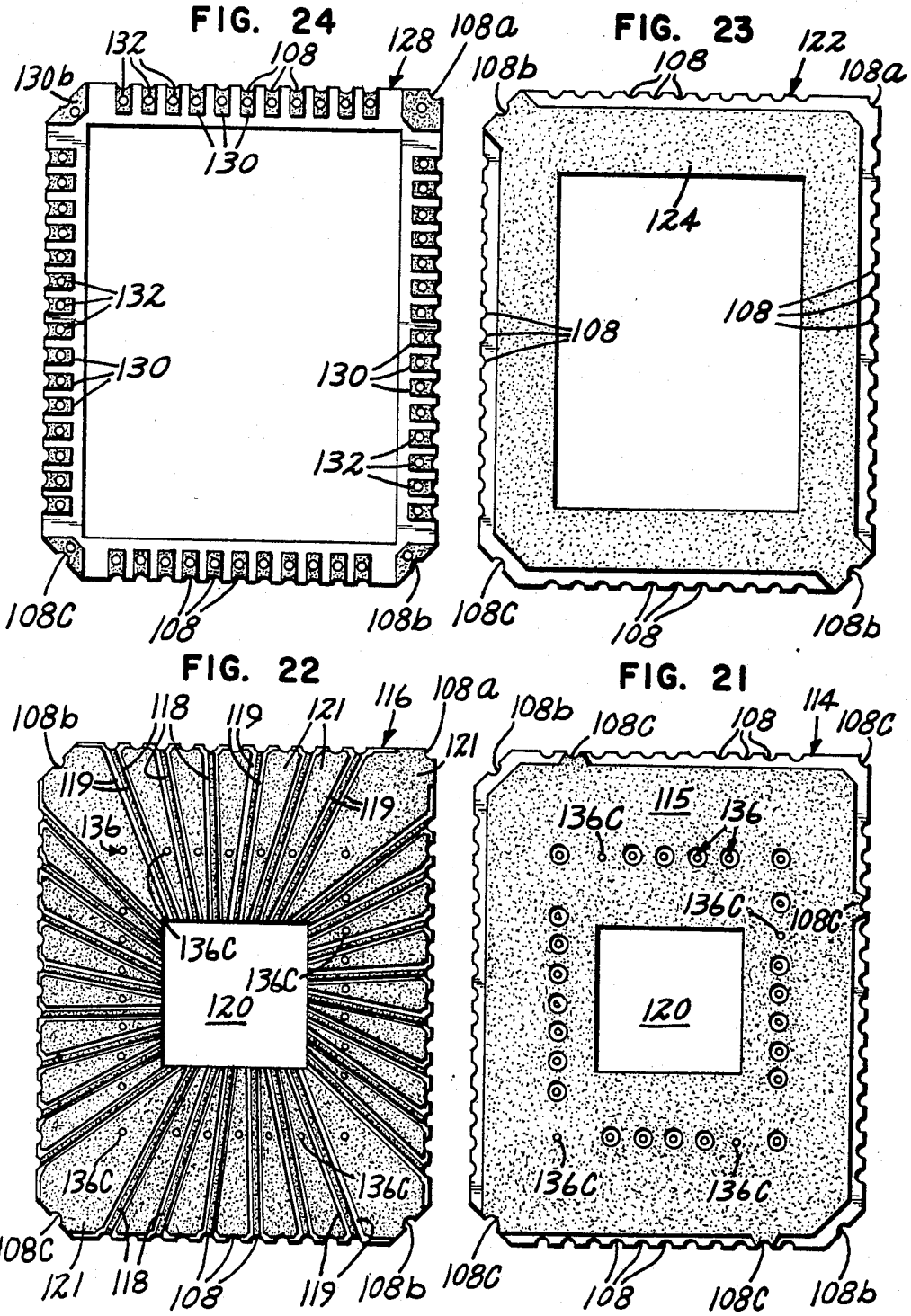

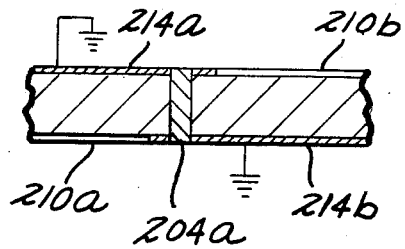
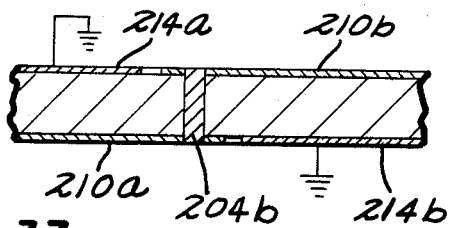
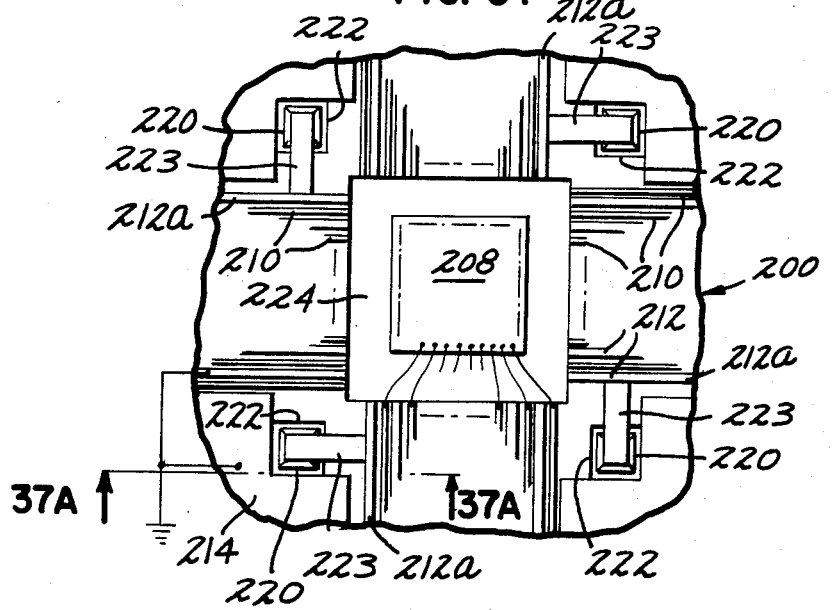
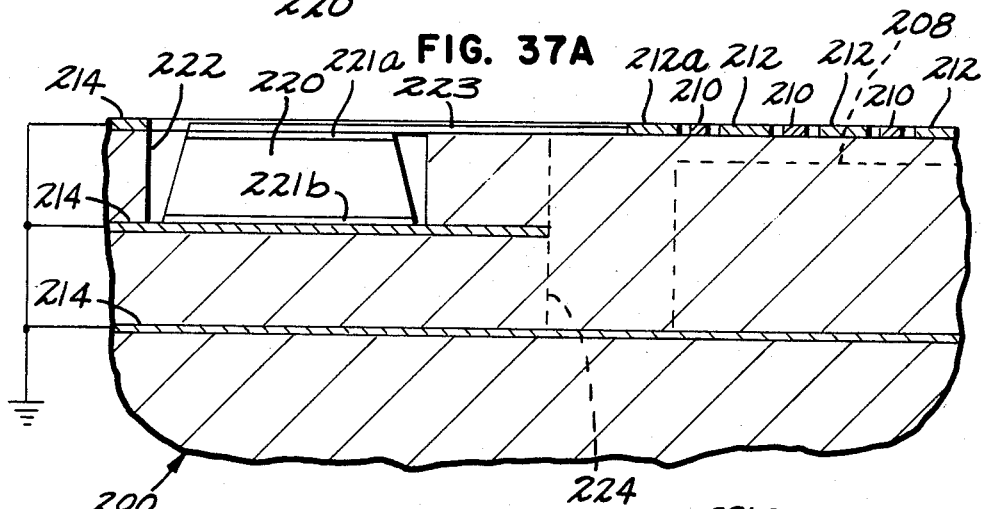
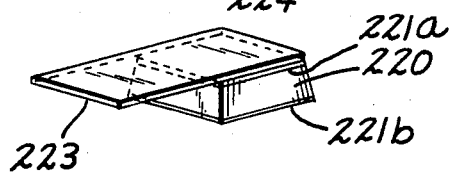

LEADLESS CHIP CARRIER APPARATUS PROVIDING AN IMPROVED TRANSMISSION LINE ENVIRONMENT AND IMPROVED HEAT DISSIPATION

This application is a continuation-in-part of Ser. No. 432,843; filed Oct. 5, 1982.

BACKGROUND OF THE INVENTION

The present invention relates to a leadless chip carrier apparatus. More particularly, the present invention relates to a leadless chip carrier apparatus suitable for high power, high frequency digital integrated circuits, hereafter referred to as logic components.

The implementation of ultra high speed processors, e.g. employing system clock rates above one hundred million cycles per second (100 MHz), requires advances in the use of subnanosecond logic components, transmission line design, the development of new packaging and logic board design, as well as fabrication techniques suitable for high speed systems. Examples of low or moderate speed logic device technology currently available are low power metal oxide semiconductor (MOS) technologies and the conventional and enhanced speed versions of transistor-transistor logic (TTL). In addition, there are several families of ultra high speed logic such as emitter coupled logic (ELC) and current mode logic (CML) which are currently fabricated with silicon technology.

The ultra high speed high families such as ECL and CML demonstrate considerable speed and performance advantages over the more familiar TTL and MOS logic families. Even higher performance logic devices relying upon the electrical properties of gallium arsenide are now becoming available. However, the ultra high speed logic families require the use of transmission line concepts for interconnections between logic components so that the speed of these latter devices can be effectively utilized. In addition, there is often the need for a greater heat dissipation capability due to the greater power requirements of the ECL and CML families. Consequently, the methods for attaching individual logic components to a circuit board or the like are also becoming increasingly critical in the design of high performance computers employing these logic families.

Traditionally, logic components have often been packaged and mounted on printed circuit boards by the use of dual in-line packages (DIP). In such packaging methods, a logic component or die is usually encapsulated in either a ceramic or plastic housing having electrical connectors extending generally downward therefrom for suitable attachment to a circuit board. Electrical leads, also encapsulated in the DIP housing, extend from the external electrical connectors to the corresponding electrical contact points on the logic die sealed inside the encapsulant.

When high speed logic components have been packaged in duel in-line packages, the resultant performance of such components when so packaged has not achieved the performance expectations or predictions for the high speed logic components as stated by the manufacturers of such components. The Applicants in analyzing this shortfall in performance have discovered that due to the substantial lengths of these internal electrical leads or interconnects and the varying configuration of the leads, an unacceptable signal delay occurs in the interconnect lines. Further, it has been impossible to maintain a transmission line environment in these interconnects, which results in signal interference and waveform degradation. Consequently, the effective speed of the logic component cannot be fully utilized.

Delay in the interconnects is partially due to the series inductance of the internal leads and the proximity or configuration of the wires to one another. In attempting to decrease signal rise and fall times, signals are driven at relatively high current levels to enable high speed logic operations to occur. As more current is provided, the series inductance of the interconnects, which is a function primarily of their length, resists the rapid changes in current flow by creating a resisting voltage spike. Typically, the longer the wire interconnect, the more series inductance which is present. Additionally, the signal interconnects which line in close proximity function as capacitors relative to one another, thereby creating a parasitic shunt capacitance which forms a signal crosstalk path between adjacent line and causes a disruption in the transmission line characteristics of the interconnects between components. These combined inductive and capacitive parasitics hinder or delay the signal in the interconnects and are significant factors in the design of high speed processor systems.

In addition, every interconnect between integrated circuit has a chracteristic impedance. If the transmission line or interconnect is not terminated with a matching impedance, signal wavefronts will be reflected, causing voltage distortion of the signal. At every location along a transmission line at which a connection is made to an integrated circuit, the characteristic impedance of the line is thereby modified. This impedance discontinuity creates the voltage reflections described above. Therefore, it is important to provide either a low shunt capacitance on the input of each package lead, or better yet, a controlled impedance transmission line environment all the way to the integrated circuit inside the package. This will avoid voltage ringing following the rising and falling edges of the signal caused by a succession of positive and negative reflections on an interconnect line in a non-transmission line environment.

In addition, dual in-line packages are very large structures which prevent tight packing of integrated circuits on a logic board. In an effort to overcome the packing density problem, leadless chip carriers have been developed. However, although these carriers also have somewhat more favorable electrical characteristics for high power, high speed logic components such as ECL of Gallium Arsenide logic than do dual in-line packages, these improvements are accidental rather than purposeful, and leave much room for further performance improvements.

Firstly, commercial leadless chip carriers are designed to be mounted on circuit boards with their ceramic surfaces in direct contact with the printed circuit board. As a result, air cooling, heat pipe cooling or cold plate cooling of currently available leadless chip carriers is not feasible. Efficient air cooling or heat pipe cooling of leadless chip carriers, however, is feasible wherein the carrier is mounted with the ceramic surface facing upward from the circuit board and the logic die cavity, covered by a suitable cover portion, facing the circuit board.

Currently, most commercial leadless chip carriers cannot be inverted in a cover down position for several reasons. The covers extend beyond the surface of the leadless chip carrier so as to raise the leadless chip carrier above the face of the circuit board, thereby preventing electrical contact between the chip carrier and the circuit board. Furthermore, the vertical electrical contact paths along the edges of the chip carrier, referred to as castellations, typically utilized in currently available leadless chip carriers, must be insulated near their upper ends to prevent short circuits between the castellations and the leadless chip carrier cover. Thus, if the leadless chip carrier is inverted, it is impossible to achieve electrical contact between the metalized, conducting castellations and the circuit board. Cooling of the logic components packaged in conventional chip carriers has been attempted by providing a suitable heat sink in the core of the circuit board, or by providing a series of conduit within the board for the passage of a coolant therethrough. However, such boards are expensive to manufacture and the design, fabrication and redesign cycles are lengthy.

Yet another problem associated with presently available leadless chip carriers is the use, during chip carrier manufacture, of metalized "plating fingers" to provide conduction paths for the flow of DC current required in the electroplating step of the chip carrier assembly process. The metalized plating fingers are utilized during the plating process to assure proper formation of the signal line traces which extend from the electrically conductive castellations at the outside edge of the carrier inwardly toward the cavity of the carrier wherein the logic die is suitably attached. The Applicants have discovered that the electroplating fingers increase the shunt capacitance between adjacent signal lines and also to the AC ground planes within the chip carrier, thereby degrading the electrical performance of the chip carrier.

Furthermore, the Applicants have discovered that the configuration of present leadless chip carriers does not effectively minimize signal crosstalk or shunt capacitance problems between adjacent signal leads for high speed operation, and presently available chip carriers do not provide adequate transmission line environments wherein the signal leads have a controlled, low level impedance, and there is also no mechanism for terminating the signal leads close to the integrated circuit with an appropriate matching impedance. As a result, signal reflections are created which limit the maximum frequency at which the high speed logic components enclosed therein can function.

Also, the Applicants discovered that presently available leadless chip carrier packaging techniques do not provide for adequate electrical and electromagnetic isolation of the logic components packaged therein from outside sources, and vice versa, and current fluctuations caused by sudden power demands, which occur when an integrated circuit switches logic states, are not properly alleviated in presently available leadless chip carrier designs.

Furthermore, methods of attaching the leadless chip carriers to the circuit board from both electrical and structural standpoints are not adequate in view of the high operating temperatures and corresponding expansion/contraction fluctuations to which the chip carriers are subjected.

While many of the above problems were solved, at least in part by the Applicant's prior application, Ser. No. 432,843, filed Oct. 5, 1982, of which this application is a Continuation-In-Part, the Applicants have made further discoveries regarding the causes of signal delay and interference/distortion observed in high-speed logic components. More particularly, in addition to other discoveries, Applicants have discovered that these observed characteristics are partially due to a lack of controlled impedance in the vertically extending signal interconnects, herein referred to as VIAs, between vertically spaced apart signal leads both within the logic component carrier itself and between the logic component carrier and the printed circuit board. The lack of controlled impedance is partially due to the fact that the VIAs do not provide a transmission line environment.

Additionally, Applicants have discovered that signal delay and interference/distortion is partially due to impedance discontinuity in vertically spaced apart AC ground planes within the logic component carrier itself. The impedance discontinuity is at least partially due to the lack of physical continuity between vertically spaced apart ground planes.

In addition, Applicants have further discovered that not only is there signal delay and interference/distortion within the carrier apparatus itself, but the various interconnects between logic components mounted on the printed circuit board also create signal delay and interference/distortion partially due to the fact that the various interconnects to a signal input lead cause voltage reflections to occur thereby distorting and interfering with the input signal.

Furthermore, many carrier apparatus are not capable of handling the large number of signal leads required of very high speed/performance logic components in various applications.

These and many other problems are solved by the present invention.

SUMMARY OF THE INVENTION

The present invention relates to the carrier apparatus for mounting logic components on the surface of a circuit board or the like. The carrier apparatus includes a housing structure defining top and bottom surfaces and further defining a cavity for receipt of a logic component (also referred to as a logic "die"). A recessed cover portion is attached to the housing so as to enclose the cavity, thereby effectively hermetically sealing the logic component in the housing. The carrier apparatus includes means for mounting the housing on a circuit board such that the cover does not make contact with the surface of the circuit board. The housing further includes means for electrically interconnecting the logic component to the circuit board.

In one embodiment of the present invention, a four layer leadless chip carrier structure is utilized. A dielectric first layer typically made of a ceramic such as alumina provides a metalized die attach surface for attachment of a logic component or die. The second dielectric layer provides metalized signal traces extending from an aperture in the center of the layer which defines the periphery of the die well, to the periphery of the carrier apparatus. The signal traces are suitable connected to signal interconnects on the circuit board. A third dielectric layer provides a collar portion onto which a lid or cover is mounted so as to enclose the die well. The lid or cover is recessed within the housing portion. A fourth dielectric layer has a number of extensions attached thereto which are utilized to attach the carrier apparatus to the circuit board.

An advantageous feature of the present invention is the ability to mount the carrier apparatus on the circuit board with the cover portion facing the circuit board such that the die well containing the die is separated from the ambient air or a cold plate by only a thin ceramic layer, thus enabling air cooling or cold plate cooling of the logic circuitry rather than cooling into the circuit board.

A further advantageous feature of the present invention is the special coplanar arrangement of the signal traces which reduces the electrical crosstalk between adjacent signal interconnects and other structures.

In yet another embodiment of the present invention, the leadless chip carrier apparatus will provide for additional heat dissipation through the use of a heat sink apparatus on the side of the carrier apparatus facing away from the circuit board.

A further advantageous feature in yet another embodiment of the present invention is the inclusion of a decoupling capacitance device which serves to minimize voltage transients on the power leads internal to the carrier which are characteristic of high speed logic components.

Additionally, one embodiment of the present invention provides for electromagnetic and electrical isolation of the logic component in the die well from outside electrical sources and vice versa. In addition, the signal traces on the present invention are fabricated without necessitating the use of electroplating traces for each of the signal traces, thereby resulting in a removal of the shunt capacitance otherwise occurring between the electroplating traces and the signal traces, and a reduction in shunt capacitance between adjacent signal traces.

Furthermore, the leadless chip carrier apparatus in the present invention is adaptable to varying sizes of die wells, thereby enabling use with varying sizes and configurations of logic components and yet assuring a minimal circuit board surface requirement to enable dense packing of logic components. The carrier apparatus accomplishes this while imposing a uniform "footprint", i.e. space requirement, on the circuit board.

The extensions utilized to mount one embodiment of the carrier apparatus on the circuit board function to dissipate stresses on the chip carrier apparatus due to heat expansion, etc. Additionally, the extensions elevate the chip carrier apparatus above the circuit board enabling flux solvents to effectively remove corrosive fluxes utilized in soldering the interstices between chip carrier apparatus and the circuit board.

In yet another embodiment of the present invention, a six layer leadless chip carrier structure is utilized such that additional layers are present to provide voltage planes and one or more ground planes. Furthermore, alternating coplanar ground and signal traces are provided. These features and others provide for enhanced voltage and ground distribution and enhanced transmission line characteristics of the individual signal traces, thereby improving characteristic impedance control of the signal lines and further reducing shunt capacitance and crosstalk between adjacent signal lines. Furthermore, in one embodiment the characteristic impedance of the signal traces is reduced.

In one embodiment of the six layer chip carrier, the alternate positioning of signal and ground traces on the signal layers, as well as the juxtaposed ground planes are configured and arranged so as to provide a coplanar/stripline transmission line environment and a coplanar/microstrip transmission line environment along portions of the signal traces.

The additional ground and voltage planes provide for further Faraday cage effects and concomitant electromagnetic and electrical shielding and isolation of the logic component in the cavity of the carrier apparatus from various outside sources and vice versa.

In yet another embodiment of the present invention, the alternating ground and signal traces are positioned in planar fashion on at least two or more vertically spaced apart horizontal planes within the housing. The positioning of ground and signal traces on a plurality of planes enables the carrier apparatus of the present invention to be utilized with logic components requiring a large number of signal leads by providing sufficient surface area for positioning of the leads.

In another embodiment of the multiple layered signal traces, the horizontal planes containing the signal traces are separated by an AC ground plane, thereby reducing cross talk between the signal leads of adjacent planes. The ground traces positioned between the signal traces are electrically connected to the overlying and underlying AC ground planes by electrically conducting VIAs positioned at closely spaced intervals along the extent of each ground trace.

In still another embodiment, the signal leads are interconnected to the electrical pathways of the circuit board or substrate by vertically extending, electrically conducting VIAs. Preferably the VIAs are arranged in rows displaced varying distances from the edge of the carrier apparatus, the rows extending generally parallel thereto. This enables a larger number of signal leads to be electrically interconnected to the circuit board than if the signal leads extended to the castellations at the edge of the carrier apparatus. Preferably the VIAs in adjacent rows are staggered for offset such that the VIAs in any given row are not in alignment with those of the rows immediately adjacent thereto.

In yet another embodiment of the present invention, ground VIAs interconnected to ground are positioned to cooperate with the signal VIAs interconnecting the signal leads so as to provide for a transmission line environment in the signal VIAs, which results in controlled impedance signals VIAs.

In still another embodiment of the present invention, decoupling capacitors are positioned in cavities in the carrier apparatus adjacent the logic component cavity so as to be relatively close to the logic component and somewhat distributed throughout the carrier apparatus.

In yet another embodiment of the present invention, the signal leads are provided with two different widths, the output signal leads having greater width than the input signal leads. Accordingly, the output signal leads have a slightly greater impedance than the input signal leads, enabling a signal output lead to be branched into a plurality of input leads without causing any signal distortion. In addition, the input signal leads are preferably terminated with their matching impedance. This will reduce voltage reflections and distortions caused by the interconnects between logic components on the circuit boards.

These and various other advantages and features of novelty which characterize the invention are pointed out with particularity in the claims annexed hereto and forming a part hereof. However, for a better understanding of the invention, its advantages, and objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

In the drawings, in which like reference numerals and letters indicate corresponding parts throughout the several views, FIG. 1 is an exploded perspective view of a first preferred embodiment of the present invention without a lid;

FIG. 2 is a perspective view of the embodiment shown in FIG. 1 with the lid removed;

FIG. 3 is a perspective view of the embodiment shown in FIG. 1 in a lid-down mounting position;

FIG. 4 is a side elevational view of the embodiment shown in FIG. 1 with portions broken away and shown in section;

FIG. 5 is a fragmentary view of the embodiment shown in FIG. 1 soldered to a circuit board;

FIG. 6 is a fragmentary top plan view of the present invention soldered to a circuit board;

FIG. 7 is a fragmentary top plan view of an alternate method of mounting the present invention;

FIG. 8 is a fragmentary cross-sectional view of the mounting illustrated in FIG. 7;

FIG. 9 is a fragmentary top plan view of an alternate method of mounting the present invention;

FIG. 10 is a fragmentary cross-sectional view along line 10—10 in FIG. 9.

FIG. 11 is a fragmentary top plan view of an alternate method of mounting the present invention to a circuit board; along line 12—12 in FIG. 11;

FIG. 13 is a fragmentary cross-sectional view of an alternate mounting method;

FIG. 16 is an elevational view with portions broken away and shown in section of the embodiment shown in FIG. 15 mounted in a cover-up position;

FIG. 17 is a perspective view of a second preferred embodiment of the present invention with the cover removed;

FIG. 18 is a top plan view of the first layer of the embodiment shown in FIG. 17;

FIG. 19 is a top plan view of the second layer of the embodiment shown in FIG. 17;

FIG. 20 is a top plan view of the backside of the first layer shown in FIG. 18;

FIG. 21 is a top plan view of a third layer of the embodiment shown in FIG. 17;

FIG. 22 is a top plan view of the fourth layer of the embodiment shown in FIG. 17;

FIG. 23 is a top plan view of the fifth layer of the embodiment shown in FIG. 17;

FIG. 24 is a top plan view of the sixth layer of the embodiment shown in FIG. 17;

FIG. 25 is a cross-sectional view with portions broken away of the embodiment shown in FIG. 17;

FIG. 26 is a fragmentary enlarged plan view of yet another embodiment of the present invention;

FIG. 27 is a diagrammatic view of a coplanar signal line environment;

FIG. 28 is a diagrammatic view of a coplanar/strip line transmission line environment;

FIG. 29 is a diagrammatic view of a coplanar/microstrip transmission line environment;

FIG. 30 is a diagrammatic view showing termination of the logic die with matching impedance;

FIG. 36A is a sectional view as seen generally along line 36A—36A in FIG. 36;

FIG. 36B is a cross-sectional view as generally seen along line 36B—36B in FIG. 36;

FIG. 37 is a plan view of an alternate embodiment of the present invention illustrating placement of decoupling capacitors within the carrier apparatus itself;

FIG. 37A is a fragmentary enlarged cross-sectional view as seen generally along the line 37A—37A in FIG. 37;

FIG. 37B is a perspective of the capacitor shown in FIG. 37A;

DETAILED DESCRIPTION OF THE FIRST PREFERRED EMBODIMENT

Figure 14:
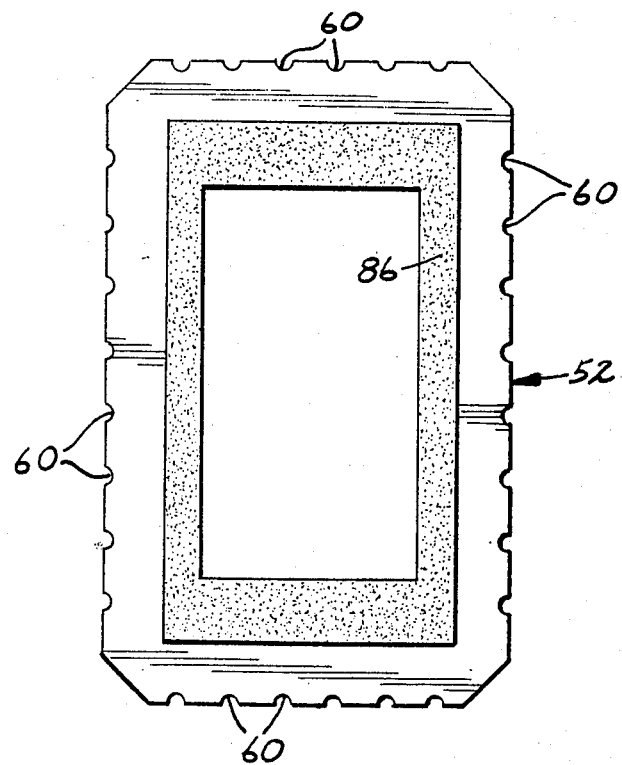
FIG. 14 is a top plan view of a third layer of an alternate embodiment including a metalized area.

Two preferred embodiments of the present invention and modifications and improvements to chip carrier apparatus in general are described in the following paragraphs. It will be appreciated that while both embodiments display enhanced mechanical and electrical properties, the second preferred embodiment provides for even further performance advantages. When utilizing high speed, high frequency logic components requiring a significant number of electrical connections with the circuit board, the use of the second preferred embodiment of the present invention is almost necessitated due to the stringent performance requirements of such high performance logic components. However, the first preferred embodiment, due to its reduced complexity and structure, is easier and less expensive to manufacture. In addition, the first preferred embodiment, when utilized with logic components requiring relatively few electrical contacts, generally provides satisfactory performance characteristics. The point at which the performance characteristics of the second embodiment outweigh the cost benefits of the first preferred embodiment generally occurs when more than 28 to 30 connections are required by the logic components.

Referring now to the drawings, there is shown in FIGS. 1 through 4 on sheets 1 and 2 a preferred embodiment of a leadless chip carrier apparatus of the present invention generally designated by the reference numeral 40. As illustrated, the leadless chip carrier apparatus 40 includes four generally rectangular layers of dielectric material, such as a ceramic, stacked on top of each other. The layers are bonded together to form a housing having a predetermined length, width and thickness. The fundamental substrate material for the carrier apparatus 40 might be 94% alumina or 96% beryllia; however, it will be appreciated that the novel features of the carrier apparatus 40 are independent of the fabrication material. However, substrates may vary in their thermal conductivity and dielectric constants and thus affect the overall efficiency of the present invention.

A first dielectric layer 42 includes on its surface facing the adjacent layer a metalized planar rectangular surface area 44, of lesser width and length than the layer 42, which is electroplated to provide a surface for attachment of a logic component or die 51. A second dielectric layer 46, defining a rectangular aperture proximate the center thereof is positioned adjacent the first layer. The aperture in the second layer 46 together with the die attach surface 44 of the first layer 42, define a die well cavity 50 for reception of the logic component or die 51. The second layer 46 includes elongated spaced electroplated signal leads or traces 48 arranged in a predetermined spaced, planar arrangement. The signal traces 48 extend between the periphery of the carrier apparatus 40 and the periphery of the die well cavity 50 and serve as the paths along which electrical signals are transmitted to the logic die 51. The second layer 46 provides for attachment of bond wires 53 or the like, as illustrated in FIGS. 2 and 4 on sheets 1 and 2, between the signal contacts on the logic component 51 in the die well cavity 50 and the signal traces 48. It will be appreciated that the metalized area 44 and the aperture defined by the second layer 46 may be of varying size such that different sizes of logic die may be mounted within the carrier apparatus 40.

A third dielectric layer 52, defining a rectangular aperture in the center thereof which is larger than the aperture defined in the second layer 46 is positioned adjacent the second layer 46. The third layer 52 functions as a spacer layer by providing a relatively flat flanged collar portion proximate the periphery of the carrier apparatus 40 for reception of a flat rectangular ceramic cover or lid 56 or the like which is of lesser width and length than the third layer. Typically the lid 56 will have a frit glass seal preform attached on its bottom surface near the periphery of the lid which enables the lid 56 to be glass sintered to the third layer upon the application of an appropriate amount of pressure and heat.

As previously mentioned, the rectangular aperture defined by the third layer 52 is larger than that of the second layer 46 such that a portion of the signal traces 48 are enclosed by the lid 56 and not in contact with the third layer. Thus along a portion of the signal traces 48, an air cavity or space separates the lid 56 from the traces 48 so as to provide an environment above the signal traces 48 with a differing dielectric constant than that of the third layer 52. The lid 56 hermetically seals the die well cavity so that the die 51 therein is not contaminated with dust particles or the like.

Lastly, a rectangular frame-like fourth layer 58 is positioned on top of the third layer 52 between the lid 56 and the periphery of the carrier apparatus so as to surround the lid 56. The fourth layer 58, in the preferred embodiment as illustrated in FIG. 4 on sheet 2, has greater thickness than the lid 56 so as to extend beyond the outwardly facing surface of the lid 56 such that the lid 56 is recessed in the carrier apparatus 40.

The carrier apparatus 40 of the present invention illustrated in FIGS. 1 through 4 on sheets 1 and 2 is mounted in a lid down position on a printed circuit board 41, with the fourth layer 58 adjacent the board 41. Therefore, it is preferable that the ceramic lid 56 not project beyond the fourth layer 58 so as to prevent or make difficult electrical contact between the circuit board 41 and the carrier apparatus 40.

More particularly, each of the layers of the carrier apparatus 40 includes a plurality of spaced, vertically extending semi-cylindrical indentations or castellations 60 along the edge thereof. Typically the castellations will be spaced such that their centers are 50 mils apart although other spacings such as 40 mils or 25 mils, etc. may be utilized. The castellations of each layer are in alignment with the other layers such that when the layers are positioned on top of one another, the castellations 60 extend from the bottom of the first layer 42 to the top of the fourth layer 58. The castellations 60 are metalized along a portion thereof so as to provide electrical pathways from the fourth layer to the signal traces of the second layer. The signal traces 48 of the second layer 46 are suitably connected with the castellations so as to provide electrical pathways from the castellations to the periphery of the die well cavity 50. The castellations, as with the die well attach surface 44, are gold electroplated to prevent oxidation, etc.

The fourth layer includes relatively thin, flat rectangular metalized contact tabs 62 suitably connected to the castellations 60 and extending inwardly a predetermined distance thereof on the top surface of the fourth layer 58 (the side of the carrier apparatus 40 which faces the circuit board in a lid down mounting position). In one preferred embodiment, the applicant has found contact tabs having a width of approximately twenty-five mils and a length of approximately thirty-five mils to be effective for certain applications. The contact tabs 62 are illustrated as not extending to the inside edge of the sides of the frame-like fourth layer 58. For example, in one embodiment the contact tabs 62 have a length of approximately thirty-five mils whereas the sides of the fourth layer have a width of fifty mils.

As illustrated in FIGS. 1 through 3, in the embodiment shown, the corners of the carrier apparatus are beveled and also have contact pads attached thereto on the backside of the fourth layer. As with the castellations, the contact pads 62 are also gold electroplated to prevent oxidation, provide an effective soldering surface, etc.

Suitably attached to the surface of each of the contact tabs 62 is an extension 64 which in the preferred embodiment is made of a tungsten material. The tungsten extenions 64 are typically four to seven mils in height, but on any given chip carrier must all be the same height within one-half mil.

The tungsten extensions 64 serve several functions. When the carrier apparatus 40 is mounted in the lid down position, the tungsten extensions 64 assure electrical contact with the circuit board 41 as illustrated in FIG. 4 on sheet 2 and raise the carrier apparatus 40 above the surface of the circuit board 41. This assures that the lid 56, which is recessed below the surface of the fourth layer 58, does not make contact with the circuit board 41. (This is important if a metalized lid instead of a dielectric lid were to be used.) This is accomplished even if the lid 56 should extend slightly beyond the surface of the fourth layer 58.

The carrier apparatus 40 typically will be soldered at the tungsten extensions 64 to corresponding metalized traces on the circuit board so as to provide appropriate electrical connection with the castellations 60 of the carrier apparatus. As illustrated in FIGS. 5 and 6 on sheet 2, a relatively uniform solder fillet 61 connects each of the castellations 60 to a metalization layer 66 on the circuit board 41.

Soldering of the carrier apparatus to the circuit board might be accomplished utilizing fluorocarbon vapor phase reflow techniques, and also employing low temperature eutectic solder having melting temperatures below two hundred degrees centrigrade (200° C.). The tungsten extensions 64 will assist in concentrating the heat during the soldering prrocess so as to provide for improved solder reflow such that the solder flows around the tungsten extensions and up the castellations to form a uniform fillet. Furthermore, the tungsten extensions 64 assist in cleaning away any of the solder fluxes from the interstices of the carrier apparatus 40 and circuuit board 41 by elevating the carrier apparatus 40 above the circuit board such that the flux cleaning solvents can flow between the carrier apparatus 40 and the circuit board 41.

Yet another method of mounting the carrier apparatus 40 is illustrated in FIGS. 7 and 8 on sheet 3 wherein the carrier apparatus 40 is placed in a cavity or a recess 63 in the circuit board 41 which is adapted for reception of the carrier apparatus. The cavity 66 might include castellations 69 which are metalized and in alignment with the castellations 60 of the carrier apparatus 40 so as to create a generally cylindrical space 68 between facing castellations when the carrier apparatus is placed in the cavity 63. The cylindrical space 69 is then filled with a solder paste 70 such that an electrical connection is provided between the castellations 60 of the carrier apparatus and the castellations 69 of the circuit board upon heating the entire assembly. The castellations 69 of the circuit board 41 are in turn attached to signal traces 71 in the circuit board providing for an electrical connection between the circuit board and the carrier apparatus.

Alternatively, as illustrated in FIGS. 9 and 10 on sheet 2, the castellations 69 in the circuit board 41 might be replaced with electrically conducting cylindrical posts 75 which are adapted for making contact with the castellations 60 in the carrier apparatus 40 as illustrated in FIG. 10. The posts 75 are in turn electrically connected to the signal traces in the circuit board, thereby completing the electrical connection to the carrier apparatus. In yet another embodiment as illustrated in FIGS. 11 and 12 on sheet 4, the posts 75 might be replaced with thin flat semi-cylindrical metalized tabs 73 adapted for making contact with the castellations 60 of the carrier apparatus. It will be appreciated, that if a recessed mounting method were utilized, the contact pads 62 and the tungsten extensions 64 may not be present as the electrical connection to the circuit board 41 is through the castellations 60.

Additionally, the tungsten extensions 64 might be utilized as contact points for mounting of the carrier apparatus 40 in a chip carrier connector 65 adapted for reception of the carrier apparatus as illustrated in FIG. 13 on sheet 4.

It will be appreciated that while in the preferred embodiment tungsten extensions 64 are utilized, the contact tabs 62 will provide the electrical connection between the circuit board 41 and the carrier apparatus 40 if tungsten extensions are not used. However, in this situation it is even more important that the lid 56 not project beyond the fourth layer 58 so that electrical contact can be made.

Referring to FIG. 1 on sheet 1, while a total of twenty-eight signal traces are shown, three of the signal traces 48a, b and c in the second layer are utilized as power and ground feeds to the logic die 51 in the die well cavity 50. Even more of the signal traces 48 might be utilized as power and ground feeds if necessary for various logic components as some logic components require two, three or even four different voltages for operation. The embodiment shown has been designed for operation with logic components requiring either one or two voltage feeds and a ground. In the embodiment shown, signal trace 48a serves as one power bus feed while signal trace 48b serves as the other power bus feed. Signal trace 48c is a ground bus feed. It will be appreciated that one of the voltage feeds need not be utilized if only one voltage level is required. Each of the three feeds are connected to vertically extending cylindrical members, hereafter referred to as VIAs, 74a, b, c respectively, which are electrically conducting and, as illustrated in FIG. 3 on sheet 1, connect the three leads to the surface of the first layer 42 which faces away from the circuit board in a lid down mounting position. The chip carrier can be designed with more VIAs if there are more than three voltage and power feeds to enable use with those components requiring a large number of power supply voltages. The applicant has found VIAs made of a cofired refractory tungsten material to be efficient in certain applications.

As illustrated in FIG. 3 on sheet 1, on the back surface of the first layer are located three planar areas of metalization 76a, b, c. The planar metalized area 76c serves as a heat dissipater or "spreader" and is connected by VIA 74c to the ground feed 48c. In the embodiment shown, metalized heat dissipation area 76c allows for solder attachment of copper heat studs (not shown) providing for further dissipation of heat.

Furthermore, connection of the back metalization area 76c and the heat studs to ground enables these structures to provide an electrical shield for the logic die 51 in the die well cavity 50; and to further provide a decoupling capacitance between the die attach metalization area 44, which is connected to a power bus line, and the metalization area 76c which is grounded. At the high operating frequency of subnanosecond logic components, this capacitance provides a nontrivial decoupling effect to minimize power supply voltage transients or spikes observed by the logic die 51 in the die well cavity 50.

In the embodiment shown in FIG. 3, the metalization areas 76a and 76b are spaced apart from area 76c. Areas 76a and 76b are suitably connected to VIA members 74a and 74b respectively, which as previously mentioned are connected to signal leads 48a and 48b. In addition, each of the metalization areas 76a, b, c is interconnected with castellations 60a, b, c, respectively, at the periphery of the carrier apparatus, which are electroplated from the contact pads 62 to the metalization areas 76a, b, c. Typically, for those logic components requiring two ground leads and one power supply voltage, e.g. ECL logic, castellation 60a is connected to the primary or minus 4.5 volt power bus on the circuit board 41 while castellations 60b and 60c are connected to ground. For those logic components requiring two power supply voltages but only one ground, e.g. Gallium Arsenide components, a somewhat different connection of ground and supply voltages to castellations 60a, 60b, 60c is employed, thereby to maintain adequate decoupling between ground and supply voltages. The interconnection of the metalized areas 76a, b, c by the vertically extending VIA members 74a, b, c and castellations 60a, b, c provides for better distribution of voltage and grounds throughout the carrier apparatus.

The metalized areas provide for attachment of small chip capacitors 80a, b or the like, diagramatically illustrated in FIG. 3 on sheet 1, between the adjacent ground and power metalization areas. Typically, these chip capacitors are suitably soldered to the metalization surface areas. The chip capacitors 80a, b serve to further decouple the die attach surface 44 to ground, thereby providing for further suppression of any voltage transients or spikes due to sudden current demands typical in high frequency logic devices. As with the castellations 60, the metalized areas 76a, b, c are electroplated to avoid oxidation, etc.

Additionally, as illustrated in FIG. 1, there are no electrical plating extensions or fingers below and between adjacent signal lines, as frequently present in current leadless chip carrier apparatus for electroplating of the signal traces. Such extensions increase the shut capacitance between signal feeds, thereby increasing the signal interference (crosstalk) between adjacent signal feeds.

In the present invention as illustrated in FIG. 1 only a single electroplating finger 78 is used. The electroplating finger 78 is located in the first layer 42 directly below a power feed and extends between the die attach area 44 and the VIA 74a. By placing this shortened plating finger beneath the power feed, the power feed gains in effect a second conductive path to the die attach area, thereby lowering the resistance of this path;in addition, the plating finger will exert a minimal shunt capacitance effect on nearby signal leads. The logic die 51 can be implanted or attached to the die attach area 44 by conventional eutectic solder scrub techniques.

The bonding wires 53 which interconnect the die 51 with the signal traces 48 have a relatively short length as the signal traces 48 extend to the periphery of the die well 50. In addition, the bonding wires 53 are able to maintain a generally parallel configuration so as to minimize parasitic capacitance. Bonding ribbons may be used rather than wires, which further enhances parallelism and flatness, further decreasing parasitic capacitance.

In addition, in the embodiment illustrated, triangular markers 84 adjacent to several of the signal traces 48 are provided to enable optically registered autobonders to align the chip carrier prior to automatic bonding of the wires or ribbons 53 from the signal traces 48 at the inner edge of the die well cavity 50 to wire contact pads on the integrated circuit itself. The same registration markers 84 allow the bonding of the contact pads of the logic component 51 to the signal leads at the edge of the chip carrier cavity 50 using a beam lead bonding approach.

While the cover or lid 56 of the carrier apparatus 40 is described as being made from a ceramic such as alumina, in an alternate embodiment, the lid 56 may be made of metal. In such an embodiment, as illustrated in FIG. 14 on sheet 5, the third layer 52 will include an area of metalization 86 such as gold plating or the like. The lid 56 will include a solder preform attached on its bottom surface near the periphery thereof to enable the lid 56 to be soldered to the third layer 52 upon the application of an appropriate amount of pressure and heat. As illustrated in FIG. 14, the area of metalization 86 is not connected to ground to minimize parasitic shunt capacitance to the signal leads 48. To further minimize parasitic shunt capacitance to the signal leads 48, the metalized seal ring 86 should be maintained as narrow as practicable consonant with an adequate solder seal to the metal lid 56. When using a metal lid it is important that the lid 56 be recessed within the carrier apparatus 40 or be raised above the surface of the circuit board 41 so as to not create an electrical short.

Figure 15:
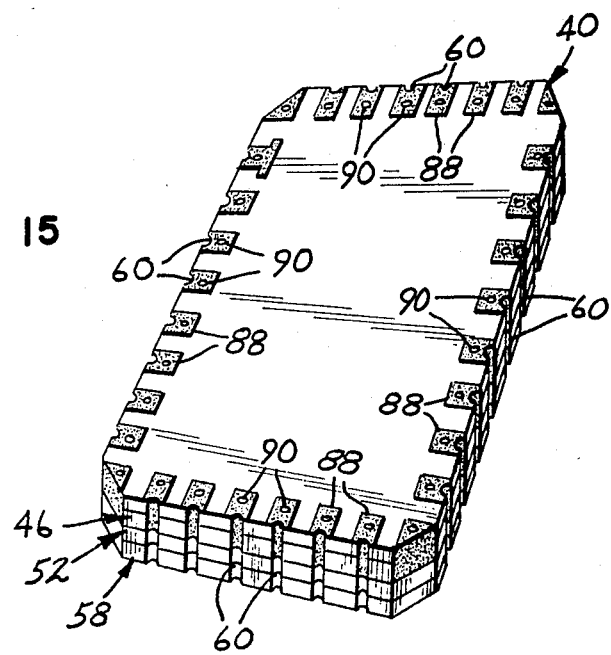
FIG. 15 is a perspective view of the backside of a modified embodiment for mounting in a cover-up configuration.

Additionally, the carrier apparatus 40 may be modified as illustrated in FIG. 15 on sheet 5 such that the carrier apparatus 40 may be mounted in a lid up position wherein the lid 56 faces away from the circuit board 41. This is accomplished by metalizing the castellations 60 so as to provide electrical pathways from the first layer 42 to the signal traces 48. In addition, metalized tabs 88, not unlike the tabs 62 of the fourth layer, are positioned on the backside of the first layer 42. The metalized contact tabs 88 provide for electrical connection between the circuit board 41 and the carrier apparatus 40. The metalized tabs 88 might also include tungsten extensions 90 to assist in electrically and structurally attaching the carrier apparatus 40 to the circuit board 41. With the carrier apparatus 40 mounted in a lid up configuration, the tungsten extensions 64, as illustrated in FIG. 16 on sheet 2, might serve as contacts for testing purposes, thereby aiding verification and checkout of the logic die 51 and the carrier apparatus assembly. In the cover up mounting position, any obstructions such as heat dissipating structures (heat studs), on the backside of the carrier apparatus which faces the circuit board, are removed so as to enable the backside to be mounted adjacent the surface of the circuit board 41. Furthermore, the metalization areas 76a, b are removed.

As previously discussed, the above described embodiment of the present invention offers several mechanical and electrical advantages over currently available chip carriers. The carrier apparatus may be mounted in a cover down position such that the logic die is separated from the ambient air by a relatively thin ceramic layer (the thickness of the fourth layer 58), thereby enabling the carrier apparatus 40 and its associated logic die 51 to be effectively air cooled. In addition, heat dissipation structures may be added to the surface of the carrier apparatus 40 facing away from the circuit board 41. Additionally, the tungsten extensions 64 of the present invention offer several advantages, such as providing more efficient soldering of the carrier apparatus 40 to the circuit board 41, functioning as probe contacts when the carrier apparatus 40 is mounted in a lid up position, serving as resilient support structures dissipating much of the stress caused by expansion and contraction of the carrier apparatus 40 due to temperature extremes, providing more efficient removal by cleaning agents of residual quantities of solder fluxes, etc. Furthermore, the present invention displays improved electrical characteristics in that the signal traces 48 exhibit a minimum of parasitic shunt capacitance and series inductance, resulting in a minimal signal distortion or disturbance. The improved signal characteristics in the signal traces 48 are in part due to the planar arrangement of the signal traces 48 on a dielectric. Furthermore the signal traces 48 are as narrow as practicable, as short as possible while maintaining generally uniform center to center spacing, and have a substantially linear boundary with few irregularities. Also, the signal traces 48 are separated by a large guard band of dielectric material. In addition, the decoupling capacitors provide for reduction of voltage transients caused by sudden current demands typical of high frequency logic components, by the storing of charge relatively close to the logic die which is readily available when required.

DETAILED DESCRIPTION OF THE SECOND PREFERRED EMBODIMENT

For purposes of this application and in accordance with generally accepted electronics terminology, the terms "voltage planes" and "ground planes" as used in this application may also be referred to as "AC ground planes", so as to underscore the fact that high frequency electrical signals interact with a voltage plane in the same way that these signals interact with a ground plane. Thus, when the phrase AC ground plane or lead is utilized in this application, the plane or lead referred to may be connected either to ground or to a power supply.

Illustrated in FIGS. 17 through 25 on sheets 3, 6 and 7 is another preferred embodiment of the present invention as generally designated by the reference numeral 100. This embodiment is particularly well adapted to high frequency logic component operation. The carrier apparatus 100 includes six generally rectangular layers of dielectric material, such as ceramic, stacked on top of each other. The layers are bonded together to form a housing having a predetermined length, width and thickness. The fundamental substrate material for the carrier apparatus 100, as with the first preferred embodiment, might be 94% alumina or 96% beryllia; however, it will be appreciated that the novel features of the carrier apparatus 100 are independent of the fabrication material. Since substrates may vary in their thermal conductivity and dielectric constants, the choice of substrate may effect the overall efficiency of the carrier apparatus 100.

As illustrated in FIG. 17 on sheet 6, each of the layers of the carrier apparatus 100 includes a plurality of spaced, vertically extending semi-cylindrical indentations or castellations 108 along the edges thereof. Typically the castellations 108 will be spaced such that their centers are 25 mils apart, although other spacing, such as 40 mils or 50 mils etc., may be utilized. The castellations 108 of each layer are in alignment with the other layers such that when the layers are positioned on top of one another, the castellations 108 extend from the bottom of the first layer to the top of the sixth layer. The castellations 108 are metalized along a portion of their full extent so as to provide electrical pathways from the bottom of the first layer to various layers of the carrier apparatus 100 as required. Typically, the castellations 108 are gold electroplated to prevent oxidation, etc.

More particularly, a first ceramic layer 102 of the carrier apparatus 100 defines two relatively flat surfaces, one of which faces a second ceramic layer 104 of the carrier apparatus 100 and the other of which will face away from the circuit board 41 when the carrier apparatus 100 is mounted on the circuit board 41 in a lid down configuration. It will further be appreciated as illustrated in FIG. 25 on sheet 3, when the carrier apparatus 100 is mounted on the circuit board 41, the first ceramic layer 102 is the layer farthest removed from the surface of the circuit board 41. As illustrated in FIG. 18 on sheet 6 the first ceramic layer 102 includes on its surface facing the second ceramic layer 104, a thin planar metalization area 106 which is connected to four castellations 108a, one of which is illustrated in FIG. 18 as being a corner castellation. At least one of the castellations 108a (preferably the corner castellation), to which the metalization area 106 is connected will be electrically connected to a power bus on the circuit board 41 and electroplated along its entire length so as to electrically interconnect the metalization area 106 to the power bus such that the metalization area 106 of the first layer 102 forms a power plane. As illustrated in FIG. 18, the metalization area 106 extends generally to the periphery of the first layer 102 but does not make contact with the castellations 108 other than the castellations 108a.

As illustrated in FIG. 20 on sheet 6, the side of the first ceramic layer 102 facing away from the second layer 104 and away from the circuit board 41, includes an area of planar metalization 110 which serves as a heat sink for dissipating heat, thereby enabling efficient air cooling, cold plate cooling, or heat pipe cooling, of the carrier apparatus 100 and its associated logic die 51.

The second ceramic layer 104 as illustrated in FIG. 19 on sheet 6 is the die attach layer providing a planar area of metalization 112 at ground potential for attachment of the logic die 51. The planar area of metalization 112 is on the side of the second ceramic layer 104 which faces away from the first ceramic layer 102 so as to be spaced therefrom and generaly parallel to the planar metalization area 106 of the first ceramic layer 102. As illustrated, the metalization area 112 is connected to twenty castellations 108b, two of which are at diagonally opposed corners, the remaining eighteen castellations 108b being along the sides of the carrier apparatus 100. At least one of the corner castellations 108b will electrically connect the metalization area 112 to ground potential such that the metalization area 112 provides a ground plane. As further illustrated, the metalization area 112 extends generally to the periphery of the second ceramic layer 104 but does not make contact with the castellations 108 other than the castellations 108b.

As illustrated in FIG. 21 on sheet 7, the carrier apparatus 100 includes a third ceramic layer 114 which has deposited on its surface facing away from the second ceramic layer 104 a planar metalization area 115. Metalization area 115 functions as a second power plane layer. Typically for those logic components requiring two levels of voltage, such as Gallium Arsenide, the metalization area 115 will be the VSS or minus 2.5 voltage plane and the metalization area 106 the VDD or minus 4.0 voltage plane. The metalization area 115 is connected to castellations 108c at four locations, one of which is located in a corner of the carrier apparatus 100 and the other three castellations 108c being along the sides of the carrier apparatus 100. At least one of the castellations 108c (preferably the corner castellation) electrically connects the metalization area 115 to a power bus of the circuit board 41.

As illustrated in FIG. 22 on sheet 7, a fourth ceramic layer 116 or a bonding finger layer includes twenty-eight elongated, flat metalized signal traces 118 of predetermined length and width extending between alternate castellations 108 at the edge of the chip carrier apparatus and the periphery of a die well cavity 120 approximately in the center of the carrier apparatus 100. The walls of the die well cavity 120 are defined by generally rectangular apertures in the fourth 116 and third 114 ceramic layers of the carrier apparatus 100. Centered between the adjacent signal traces 118, and spaced therefrom are AC ground metalization traces 121 which serve to reduce cross-talk between the adjacent signal traces 118. The ground and voltage metalization traces 121 also extend between alternate castellations 108 at the edge of the carrier apparatus 100 and the die well cavity 120.

The signal traces 118 are located on the surface of the ceramic fourth layer 116 facing away from the ceramic third layer 114 so as to be spaced from and generally parallel to the ground and voltage planes positioned on the surfaces of the first 102, second 104 and third 114 layers of the carrier apparatus. The traces 118 and 121 have a substantially linear boundary with few irregularities. The signal traces 118 are fabricated as narrow as practical and as uniformly as possible. For example, signal traces having a width of 10 mils preferably are made to a tolerance of ±0.5 mils or less. However, the signal traces 118 are not narrowed to an extent where the increase in series inductance overcomes the other electrical benefits derived. Furthermore, the signal traces 118 and the AC ground traces 121 lie in the same general plane so as to have a planar arrangement. The AC ground traces 121 are of varying width, with the width of the tracks 121 becoming greater towards the outer margins of the carrier 100. In particular, the traces 121 electrically connected to the corner castellations 108 have enlarged surface areas making them especially efficient as ground or voltage leads, whereas the other non-signal traces 121 are preferably utilized for ground traces.

In an alternate embodiment illustrated in FIG. 26 on sheet 4, the signal traces 118 do not extend to the castellations 108 at the periphery of the carrier apparatus 100, but are terminated at vertically extending cylindrical-like posts or VIAs 117 which are electrically conducting. The VIAs 117 extend to the lid side of the carrier apparatus 100 or the side of the carrier apparatus facing the printed circuit board 41 to enable electrical contact with the corresponding signal traces of the circuit board 41. The VIAs 117 and their associated surface contact pads may be staggered to form concentric rows, thereby minimizing the size of the leadless chip carrier.

As illustrated in FIG. 23 on sheet 7, a fifth ceramic layer 122 includes on its surface facing away from the fourth layer 116, a generally planar, frame-like area of metalization 124. Metalization area 124 serves as an attachment surface for a metal lid 126 which encloses the die well cavity 120. The frame-like metalization area 124 is connected to the two castellations 108b at diagonally opposite corners. The corner castellations 108b electrically connect the metalization area 112 to ground such that the cover 126 is grounded when placed on top of the frame-like metalization area 124. The metalization area 124 extends generally to the periphery of the carrier apparatus 100 but does not make contact with the castellations 108 other than the two castellations 108b at the diagonally opposite corners.

The signal traces 118 have a generally uniform width, with, however, the width becoming slightly greater at the point where the signal traces emerge from under the area of frame-like metalization 124, thereby to maintain a constant electrical impedance over the entire length of each of the signal traces 118.

As illustrated in FIG. 24 on sheet 7, a sixth ceramic frame-like layer 128 having a thickness greater than the cover 126 is positioned adjacent the fifth layer between the cover and the periphery to the carrier apparatus. The sixth layer 128 has the rectangular contact pads 130 extending a predetermined distance inward of each castellation 108. Positioned on each of the contact pads 130 are the tungsten extensions 132 similar to the extensions 64 of the four layer carrier 40. The tungsten extensions 132 perform a function similar to those of the four layer carrier apparatus 40. Thus, as illustrated in FIG. 25 on sheet 3, when the carrier apparatus 100 is mounted on the circuit board 41 in a lid down position, the carrier apparatus 100 and the recessed lid 126 are elevated above the circuit board 41.

More particularly, in the embodiment shown there are fifteen contact pads 130 on each of the long sides of the carrier apparatus, eleven pads on each of the short sides and four corner pads. Typically the contact pads 130 along the sides of the carrier apparatus will have a 25 mil center to center spacing; however, other spacing such as 50 mils may be utilized. Each of the castellations 108 is electrically connected to one of the contact pads 130. Consequently, as with the signal traces of the fourth layer 116, the contact pads 130 are arranged such that those contact pads 130 electrically connected with the signal traces 118 are separated from one another by a contact pad electrically connected to the ground or voltage leads 121. This aids in reducing the crosstalk effects between neighboring signal lines. A total of twenty-eight contact pads are connected to signal traces 118, while a total of twenty-eight contact pads are connected to ground or voltage traces. The contact pads 130, as with the contact pads 62 of the four layer carrier apparatus, assist in providing for electrical connections to the circuit board.

As previously noted, the six layer chip carrier apparatus 100 includes additional features providing for high frequency, high power logic operations. The grounding of the metal lid 126 by the metalization area 124 enables the cover to function as a planar ground barrier having a "faraday cage effect" in the die well cavity 120, thereby preventing any signal leakage from the die well cavity and prohibiting any outside interference with the logic component 51 on the inside thereof.

Furthermore, the alternating signal traces 118 and the AC ground traces 121 reduce crosstalk between adjacent signal leads. The traces 121 serve to isolate the signal leads from one another by providing a transmission line enviroment of alternating ground (G) and signal (S) leads as diagrammatically illustrated in FIG. 27 on sheet 4.

The six layer chip carrier is illustrated as including a plurality of the VIAs 136 extending between the plurality of ground and voltage planes of the various layers. It will be appreciated that while a specific embodiment is illustrated, varying numbers of voltage planes and ground planes along with varying numbers and configurations of VIAs, and varying numbers of signal traces, e.g. 68, etc., might be utilized in keeping with the principles of the present invention.

As illustrated in FIG. 22 on sheet 7, all the ground and voltage traces 121 of the fourth ceramic layer 116 are inteconnected to the vertically extending VIAs 136.

Four of the VIAs 136c are illustrated in FIG. 21 on sheet 7 as being electrically connected to the metalization area 115 of the third ceramic layer 114. The remaining VIAs 136 pass through the metalization area 115 but are separated from the metalization area 115 so as not to make contact therewith. This is accomplished by having the VIAs 136 pass through cylindrical apertures in the metalization layer 115 which are larger in diameter than the VIAs 136, thereby assuring that a predetermined space or gap separates the VIAs 136 from the metalization. As illustrated in FIG. 19 on sheet 6, twenty of the VIAs 136b extend through to the second ceramic layer 104 where they make contact with the ground metalization area 112. As illustrated in FIG. 18 on sheet 6, four other VIAs 136a extend through to the power plane metalization area 106 of the first ceramic layer 102 where they make contact therewith. The VIAs 136 assure better and more even distribution of the ground and voltage potentials throughout the various layers of the carrier apparatus 100.

Additionally, some of the VIAs 136 attached to the various ground planes and the voltage planes are illustrated in FIG. 20 on sheet 6 as extending through to the back side of the carrier apparatus 100. As illustrated in FIGS. 19 and 20 on sheet 6, four of the VIAs 136b interconnected to the ground metalization plane 112 of the die attach area are also interconnected to the large area of metalization 110 on the back outer surface of the carrier 100, which in turn is connected at two diagonally opposed corners to the castellations 108b. Additionally there are four VIAs 136d, which interconnect the metalization area 112 to the metalization area 110 on the outer surface of the chip carrier 100. Metalization area 110 thus forms a ground plane on the back surface of the carrier apparatus which, in a lid down mounting configuration, faces away from the circuit board 41.

Additionally, two of the VIAs 136a and 136c are illustrated as interconnected to small areas of metalization 140 and 142 respectively, which are spaced from metalization area 110 and are also in turn connected to corner castellations 108a and 108c at the periphery of the carrier apparatus, thereby forming voltage planes. The voltage plane 140 and the voltage plane 142 may be decoupled to the ground plane 110 by suitable decoupling capacitors 144 interconnecting the voltage and ground planes as diagramatically illustrated in FIG. 20 on sheet 6. The decoupling capacitors 144 function to store electrical charge at a location very close to the logic die 51 so as to assist in minimizing voltage transients or spikes caused by sudden current demands.

Furthermore as illustrated in FIG. 20, additional VIAs 136c and 136a may be interconnected to other small areas of metalization 143, 145 on the back surface to form additional voltage planes which may also be decoupled by capacitors 146 interconnecting the voltage planes 143, 145 with the ground plane 110. It will be appreciated that various combinations of voltage planes may be decoupled and that various of the VIAs may be connected to various areas of metalization in keeping with the principles of the invention.

The metalization area 110 on the back surface of the first layer 102 also provides for heat dissipation, thereby enabling efficient air cooling or cold plate cooling of the carrier apparatus 100 as with the four layer carrier 40. Additionally, as with the four layer carrier apparatus, copper heat studs or heat pipes (not shown) or the like might be attached to provide for even greater heat dissipation.

The various spaced, roughly parallel power planes and ground planes located throughout the various layers of the carrier apparatus 100 create a transmission line environment for the signal lines in the carrier apparatus 100 such that the signal lines have a low, well controlled impedance value, e.g., 50 ohms or 75 ohms. This is accomplished partially by the use of co-planar/microstrip and co-planar/stripline transmission line techniques. The co-planar/microstrip transmission line environment is present in that portion of the signal traces 118 under the metal lid 126 which is grounded, while the remaining portion of the signal traces 118 exhibit a co-planar/stripline transmission line environment. Though not shown in the figures, the signal traces 118 and the spaces 119 must change width slightly, becoming wider, as the signal traces 118 emerge from the metalization area 124, so as to maintain a constant impedance across the structural boundary. As diagrammatically illustrated in FIG. 28 on sheet 4, the metalization area 124 of the fifth ceramic layer 122 forms a ground plane above and spaced from the signal traces 118 (S) and AC ground traces 121 (G), and the metalization area 115 of the third ceramic layer 114 forms a second AC ground plane below the traces. The signal traces 118 and the AC ground traces 121 between the two planes are positioned and configured in accordance with co-planar/stripline transmission theory so as to effectuate the co-planar/strip-line environment. Inward from the metalization area 124 and under the lid 126 the alternating signal 118 and AC ground traces 121 form with the AC ground plane 115 there below, a co-planar/microstrip transmission line environment as disgrammatically illustrated in FIG. 29 on sheet 4.

Additionally, when using high frequency logic components, it is important to "match" the load at the end of the transmission line to the characteristic impedance of the transmission line. A transmission line terminated with a load matched to its characteristic impedance will transfer an applied signal pulse to the termination point without any voltage reflection, thereby assuring no signal distoration or disruption. Furthermore, the impedance looking into such a terminated transmission line at any frequency is the characteristic impedance.

The present invention includes a plurality of VIAs 136e mounted in the die attach second ceramic layer 104 as illustrated in FIG. 19 on sheet 6. The VIAs 136e have a gap or space separating them from the ground metalization area 112 on this layer so as to be electrically isolated therefrom. The VIAs 136e extend vertically to the back of the carrier apparatus as illustrated in FIGS. 18 and 20 on sheet 6 thereby providing connection points at the die attach surface where wires from the logic die can be bonded.

Typically, the logic die will have internal resistors which can be connected to the end of the VIAs 136e at the die attach surface. The end of the VIAs 136e on the back side of the carrier can then be grounded by a user as necessary, thereby terminating the signal lines in their characteristic impedance directly on the logic component 51 itself, which is the closest termination and therefore the preferred. If the die does not have an internal resistor, a resistor 151 can be soldered to the VIAs 136e at the back side of the carrier apparatus, as diagrammatically illustrated in FIG. 30 on sheet 4.

Further embodiments displaying modifications and improvements to the leadless chip carrier apparatus of the present invention are illustrated in FIGS. 31-39 on sheets 8-11. While it will be appreciated that most of these embodiments are intended for adaptation to the preferred embodiment herebefore generally referred to by the reference numeral 110, the concepts and principles of these embodiments are applicable to other chip carrier apparatus.

Figure 31:
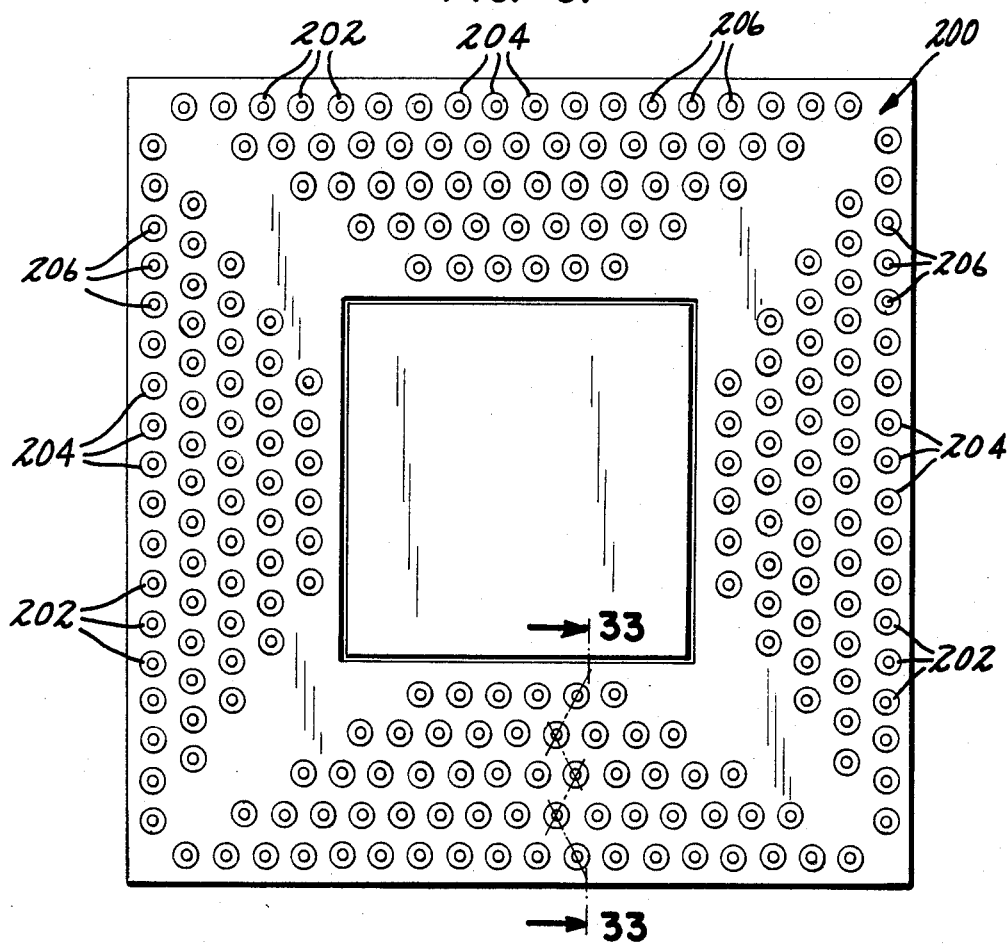
FIG. 31 is a bottom plan view of an alternate embodiment of the present invention.
Figure 32:
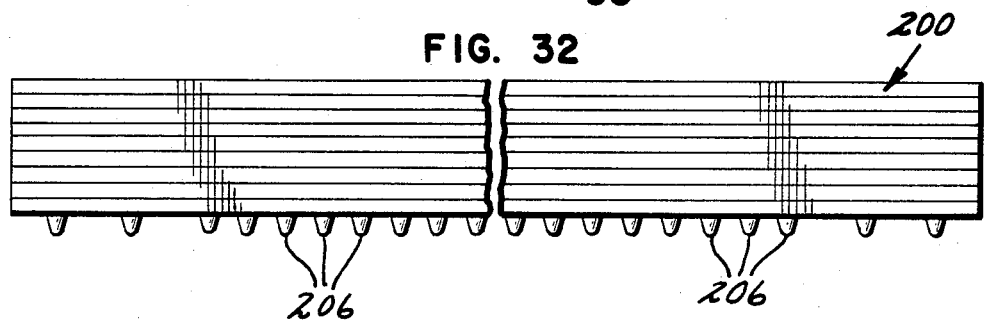
FIG. 32 is an enlarged side elevational view of the embodiment shown in FIG. 31 with portions broken away.
Figure 33:
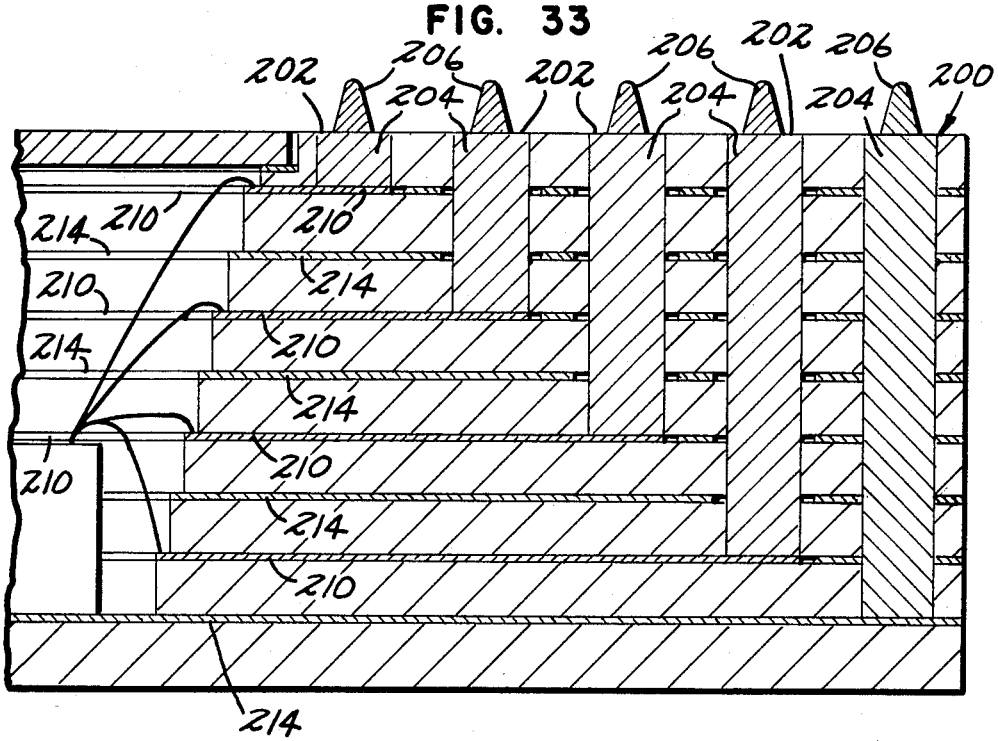
FIG. 33 is an enlarged fragmentary cross-sectional view as generally seen along line 33—33 in FIG. 31.

Illustrated in FIG. 31 on sheet 8 in a plan view of an embodiment of the chip carrier apparatus of the present invention generally designated by the reference number 200, wherein the chip carrier 200 includes a plurality of sequential rows of contact pads or projections 202 extending generally parallel to the edge of the chip carrier, each of the rows being displaced varying distances from the edge of the carrier 200. In the embodiment shown, there are five rows along each side, with adjacent rows being staggered or offset as illustrated in FIGS. 31 and 32, so as to not be in alignment with the contact pads of the adjacent rows. In the preferred embodiment shown, the contact pads 202 are aproximately fifty mils apart with the rows being also spaced fifty mils apart. In the embodiments shown, the contact pads 202 of adjacent rows are offset from each other by approximately twenty-five mils. The contact pads 202, as illustrated in FIG. 33, are interconnected to vertically extending VIAs 204 not unlike the VIAs 136 previously discussed. Accordingly, the VIAs 204 and their corresponding contact pads 202 provide for electrical connection of the various signal leads and ground leads, AC ground planes, and voltage planes of the chip carrier 200 to corresponding electrical pathways in the printed circuit board. In the embodiment shown in FIG. 31, there is provision for two hundred forty interconnects between the circuit board and the carrier apparatus. Additionally, as with the previous embodiments, the carrier apparatus 200 might also include castellations along the edges thereof providing for even more interconnects.

As further illustrated in FIG. 32, the ends 206 of the contact pads lie in the same general plane so as to assure a solid interconnection to the circuit board by such techniques as vapor phase reflow soldering. In addition, the contact pads 202 preferably have the configuration of a right circular cone, of which the top portion might be truncated.

The plurality of contact pads 202 and the corresponding VIAs 204 enable the chip carrier 200 to be utilized with a logic component or die 208 having a large number of signal leads. The contact pads 202 thus provide a structure for connecting the leads to the circuit board without the use of castellations along the edge of the carrier, which has a limited area.

Additionally, as illustrated in FIG. 33 on sheet 9, due to the large number of signal leads, it may be necessary to place the alternating signal leads 210 and their corresponding ground leads 212 on vertically spaced apart planes with an AC ground plane 214 positioned in between. As illustrated in FIG. 33, the signal leads 210 and the AC ground planes 214 are interconnected to appropriate VIAs 204, which are correspondingly connected to connections on the circuit board itself. By positioning the signal leads 210 on more than one layer, the number of signal leads present may be vastly increased, due to the increased surface area available. As with the previous embodiments, the alternating signal 210 and ground leads 212 will have a co-planar arrangement on each of the planes wherein located; however, they will be arranged on more than one layer. This will increase the number of layers present in the six layer carrier embodiment 100 depending on the number of planes utilized for signal leads.

In this embodiment, the ground traces positioned between adjacent signal traces are electrically interconnected to the overlying and underlying AC ground planes by electrically conducting VIAs positioned at closely spaced intervals along the extent of the ground traces; e.g. every 100-200 mils depending on the frequency. The higher the frequency, the closer the spacing between adjacent VIAs.

Figure 34A:
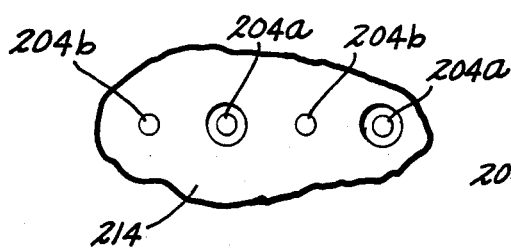
FIG. 34A is a fragmentary plan view of signal and ground VIAs configured to provide a transmission line environment along the signal VIA.
Figure 34B:
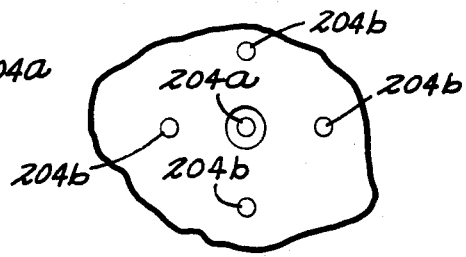
FIG. 34B is a view similar to FIG. 34A of an alternate configuration.
Figure 35:
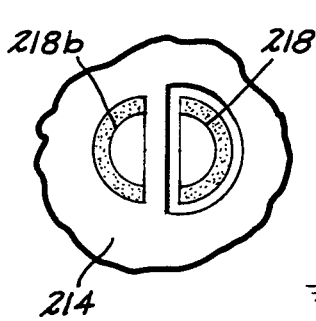
FIG. 35 is a view similar to FIGS. 34A, B of yet another alternate configuration providing a transmission line environment in the signal VIA.

As illustrated in FIGS. 34A, B and 35 on sheet 9 the impedance in the VIAs 204a connected to signal leads may be controlled by positioning VIAs 204b connected to ground 214 adjacent thereto. The signal VIAs 204a and the ground VIAs 204b cooperate to provide a transmission line environment wherein the impedance is controlled. In FIG. 34A, a ground VIA 204b is shown positioned between each signal VIA 204a in linear fashion. In FIG. 34B, four ground VIAs 204b are shown symmetrically positioned about the signal VIA 204a. The ground VIAs 204b are positioned relatively close to the signal VIAs 204a and extend generally parallel thereto. Illustrated in FIG. 35 is an alternate approach to the concept of controlled impedance VIAs, wherein a single VIA 204 includes a metalized layer 218 about a major portion thereof. The VIA and its metalized layer are separated to form two separate metalized layers having a semi-circle cross section. One of the layers 218a is interconnected to a signal lead and the other layer, 218b, is interconnected to ground 214. The cooperating signal and ground metalization layers 218a, b of the VIA 204 provide a transmission line environment for the signal along the longitudinal extent of the VIA.

Figure 36:
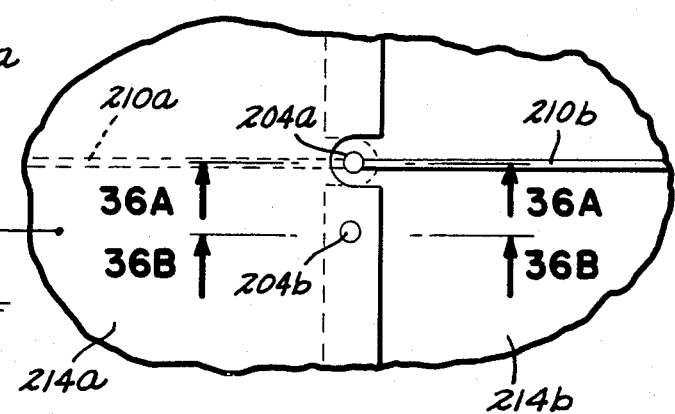
FIG. 36 is a fragmentary plan view of an embodiment of the present invention providing for ground plane continuity of ground planes at varying levels.

The Applicants have discovered that ground plane continuity is very essential in efforts to maintain transmission line environments and avoid signal interference/distortion. In an embodiment of the present invention as illustrated in FIGS. 36 on sheet 9 an 36A, B on sheet 10, ground plane continuity between different layers or levels of the carrier apparatus is provided by interconnecting the AC ground planes 214a, b, positioned at different levels within the chip carrier by a VIA 204b in close proximity to the signal VIA 204a interconnecting two signal leads 210 positioned at different levels within the chip carrier appartus 200. The ground plane continuity reduces impedance discontinuity. Also the VIA 204b adjacent to the signal VIA 204a assists in providing a transmission line environment in the signal VIA 204a as previously discussed.

As previously indicated, it is preferable to locate decoupling capacitors close to the logic component or die 208 so as to store electrical charge and assist in minimizing voltage transients or spikes caused by sudden current demands. In one embodiment of the present invention, decoupling capacitors 220 are placed in cavities 222 within the carrier housing adjacent the die cavity 224. As illustrated in FIG. 37 on sheet 10, this enables the decoupling capacitors 220 to be positioned relatively close to the logic die 208. As illustrated in FIG. 37, there might be a decoupling capacitor cavity 222 in each corner of the die cavity 224. A single one or a plurality of the capacitors might be placed in each of the cavities. Preferably, the decoupling capacitors 220 are somewhat evenly distributed, at various locations throughout the carrier apparatus in a somewhat symmetrical pattern.

As illustrated in FIG. 37, the capacitors 220 preferably have a metalized top and bottom layer 221a, b, the bottom surface of the cavities being formed by one of the AC ground planes 214 for making electrical contact with the bottom metalized surfae 221b of the capacitor 220. The capacitors 220 in the preferred embodiment are illustrated as being interconnected to the appropriate power leads 212a by a ribbon wire 223. As illustrated the ribbon wire 223 is substantially the same width as the capacitor 220 and makes contact with substantially the entire metalized surface 221a of the capacitor 220. Accordingly, the inductance of the ribbon wire 223 is minimized. Typically the ribbon wire 223 might be soldered to the power lead 212a and fused or suitably interconnected to the capacitor 220, the capacitor 220 also being typically soldered to the AC ground plane 214. Additionally, the top surface of the capacitor 220 is vertically positioned such that the ribbon wire 223 lies in a substantially horizontal plane. It will be appreciated that the power leads 212a might be interconnected to the capacitors 220 by other methods such as by the use of multiple bond wires. Furthermore, in the preferred embodiment, the capacitor 220 is illustrated as having generally inwardly converging side walls from the bottom to the top thereof.

Decoupling capacitors might be utilized on the back side of the carrier apparatus as previously illustrated for lower frequency components where the distance separation between the capacitor and the logic component is not so critical.

Figure 38:
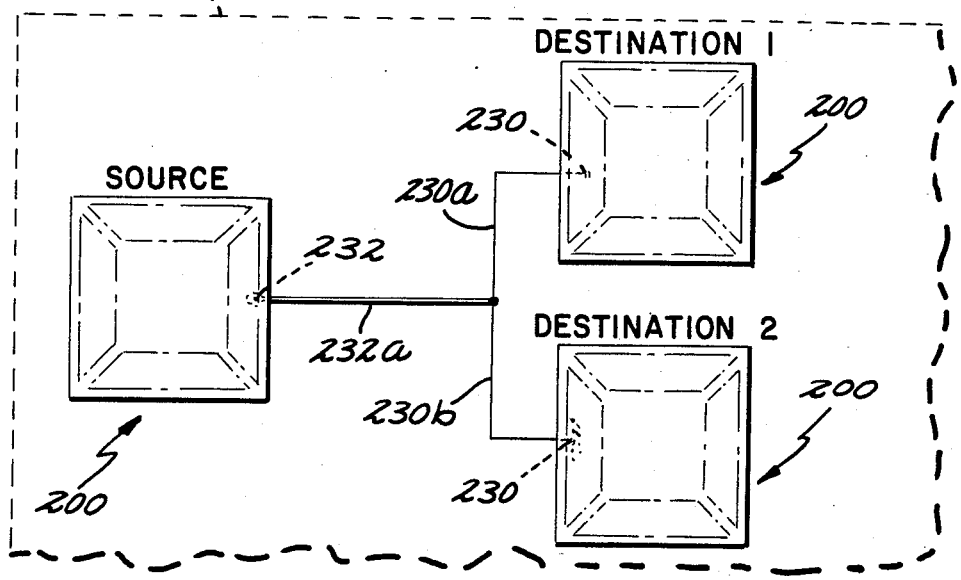
FIG. 38 is a plan view of a logic component interconnected to two other logic components on a circuit board.
Figures 38A, 38B:
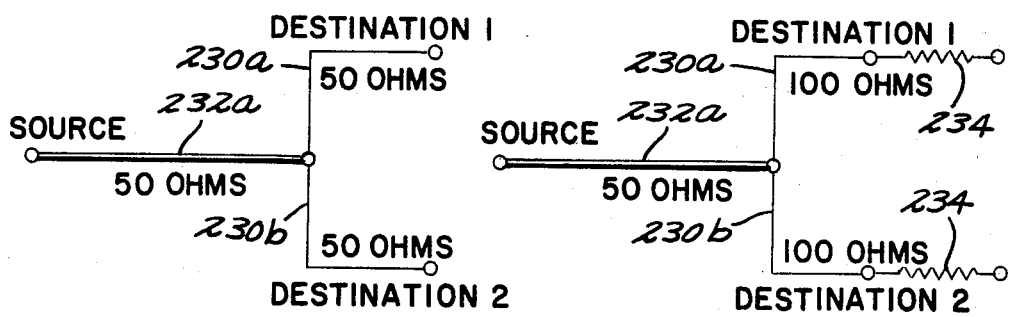
FIG. 38A is a schematic of the plan view generally shown in FIG. 38 wherein the input signal leads have an impedance which is the same as that of the output signal lead.
FIG. 38B is a schematic of the plan view generally shown in FIG. 38 wherein the input signal leads have a different impedance than the output signal lead.
Figure 39:
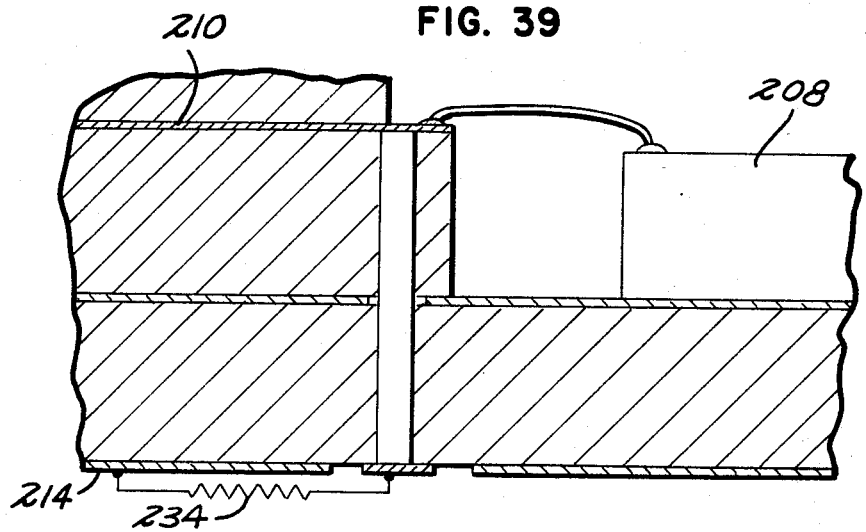
FIG. 39 is an enlarged fragmentary sectional view illustrating placement of a termination resistor of an input signal lead on the back side of a carrier apparatus.

In yet another embodiment of the carrier apparatus 200 as generally illustrated in FIGS. 38 and 38A, B on sheet 11, the signal leads 210 have a different width or impedance depending on whether utilized as an input signal lead 230 or an output signal lead 232. In addition, as previously discussed, each of the input signal leads 230 will preferably be terminated with its matching impedance by the use of a resistor 234. It will be appreciated that the resistors 234 might be mounted on the backside of the carrier as illustrated in FIG. 39 on sheet 11, on the logic component itself, or at some other location within the chip carrier. By differing the widths of the input and output signal leads, the output signal leads having a greater width than the input signal leads so as to exhibit a slightly greater capacitive value and hence a lower transmission line impedance, the voltage reflection problem observed on traditional interconnects, as schematically illustrated in FIG. 38A, will be largely alleviated. In certain applications the output signal line might have a fifty ohm impedance while the input signal lines might have a one hundred ohm impedance. Accordingly, when the output signal line 232 from a source is interconnected to the input signal lines 230 of two destinations as schematically illustrated in FIG. 38B, the combined parallel input impedances of both the destination input signal lines will be equal to the output impedance of the source output signal line. Because no impedance discontinuity is observed by the outwardly traveling signal wavefront propagating from the source, both the transient and steady state voltage of each of the input leads 230 will be the same as that of the output lead 232. As generally illustrated in FIGS. 38 and 38A and 38B, the corresponding leads 230a, b and 232 on the printed circuit board 41 will also have different widths.

It will be appreciated that the actual splitting or the connecting of multiple destinations might occur at various locations. In one embodiment, not shown, the output signal lead is split near the source such that the interconnecting leads on the circuit board are then of the same relative length for timing considerations. However, this configuration will occupy substantial space on the circuit board. Another alternative, not shown, is to interconnect the second destination next to the input lead for the first destination. By providing the input signal leads with a different impedance than the output signal lead such that the combined impedance of the input leads is the same as that of the output lead, voltage wave reflection or distortion is reduced when the multiply interconnected integrated circuits or logic components are exposed to a short rise time base band pulsed signal or the like. Accordingly, the operational speed of the logic components is enhanced as it is not necessary for the gating process to be delayed to enable the wave reflections to settle down. It will be appreciated that several logic components might be daisy chained to allow a single source to communicate with a plurality of destinations.

The leadless chip carrier of the present invention is made by forming flat sheets of a suitable dielectric material according to conventional methods. The dielectric material utilized might be, for example, a ceramic material or an organic material such as polyimide. Conventional punch tools, etching methods, or additive processes are then used to create the pattern of each of the individual layers, e.g. the castellations, apertures for the VIAs etc. Metal screen or photolithographic techniques are then utilized to form the various metalization areas on the layers. The layers are then added sequentially one upon the other or stacked on top of one another depending on whether an organic or ceramic material is used for the substrate and the vertically extending apertures are filled with tungsten powder composite or plated metal to form the electrically conducting VIAs extending between layers. Stacked layers are then fired together (cofired) in a furnace at temperatures sufficiently hot to fuse the ceramic layers together, or are laminated together under pressure and cured into a monolithic unit if organic layers are employed. After firing or laminating and curing, all exposed metalized areas are electroplated, preferably with gold over nickel so as to protect the surfaces against oxidation and to provide a surface for more efficient soldering. After placing a die in the die well cavity and connecting the die with bond wires or bond beam leads to the appropriate signal traces 118, the metal lid 126 is soldered onto the carrier thereby hermetically sealing the die.

It is to be understood that even though the above numerous characteristics and advantages of the invention have been set forth in the foregoing description, together with details of the structure and function of the invention, the disclosure is illustrative only, and changes may be made in detail, especially in matters of shape, size and arrangement of parts within the principle of the invention, to the full extent indicated by the broad general meaning of the terms in which the appended claims are expressed.

What is claimed is:

1. A carrier apparatus for mounting logic components on a mounting surface having electrical pathways such as a circuit board, comprising:
   (a) a housing defining top and bottom surfaces, said housing further having a cavity for receipt of a logic component;
   (b) lid means for enclosing said cavity;
   (c) a plurality of electrical pathways positioned within said housing, said electrical pathways being positioned on at least two vertically spaced apart horizontal planes within said housing so as to have a "co-planar" arrangement on each of said horizontal planes, said electrical pathways further being horizontally spaced apart from one another and configured to minimize parasitic inductance and capacitance of individual electrical pathways, said electrical pathways being embedded between spaced apart planes selected from voltage and ground planes, said electrical pathways cooperating with said planes to provide a transmission line environment along said electrical pathways;

(d) vertically extending means for electrically interconnecting said electrical pathways in said housing with the electrical pathways on said mounting surface, said vertically extending means including vertically extending signal means configured to cooperate with corresponding vertically extending ground means spaced apart from said vertically extending signal means and extending substantially parallel to said vertically extending signal means, said vertically extending signal means and said vertically extending ground means cooperating to provide a transmission line like environment along said vertically extending signal means wherein said vertically extending signal means display a controlled impedance; and (e) means for structurally attaching the carrier apparatus to said mounting surface.

2. A carrier apparatus in accordance with claim 1, wherein said vertically extending means include VIA means, one end of each of said VIA means projecting a predetermined distance beyond said housing, said ends lying substantially in a horizontal plane, thereby providing for interconnection of said VIA means to said mounting surface.

3. A carrier apparatus in accordance with claim 1, wherein said vertically extending means are arranged in rows generally parallel to the edge of said housing, said vertically extending means in adjacent rows being staggered or offset from one another such that elements of adjacent rows do not lie in the same column.

4. A carrier apparatus in accordance with claim 2, wherein said ends of said VIA means have a right circular conical shape, said ends providing for attachment to the mounting surface.

5. A carrier apparatus for mounting logic components on the surface of a circuit board, comprising:

(a) a housing structure having first and second major surfaces, said housing structure having a cavity extending from one of said major surfaces into said housing, said cavity adapted for receipt of a logic component;

(b) a lid portion for hermetically sealing the component in said cavity;

(c) electrical leads extending horizontally from said cavity toward the periphery of said housing, said electrical leads being arranged in a predetermined spatial coplanar configuration, said electrical leads including alternating signal and ground leads so as to minimize cross talk between adjacent signal leads, a first portion of said signal leads being covered by said lid portion, a second portion of said signal leads being not covered by said lid portion, said electrical leads also being at least partially positioned between overlying and underlying spaced apart planes selected from ground and voltage planes, said planes being positioned substantially parallel to said electrical leads, said planes cooperating with said alternating signal and ground leads to provide a transmission line environment along said signal leads;

(d) means for mounting said housing on the circuit board with said lid portion facing the circuit board; and (e) vertically extending signal VIA means electrically interconnecting at least some of said signal leads to corresponding leads on the circuit board, said signal VIA means cooperating with ground VIA means interconnected to ground to provide a transmission line environment along said signal VIA means exhibiting controlled impedance.

6. A carrier apparatus in accordance with claim 5, wherein said lid portion is electrically conducting.

7. A carrier apparatus in accordance with claim 5, wherein said lid portion is made from a dielectric material.

8. A carrier apparatus in accordance with claim 5, wherein adjacent spaced apart planes selected from ground and voltage planes are interconnected by vertically extending ground VIA means thereby providing impedance continuity between said vertically spaced apart planes.

9. A carrier apparatus in accordance with claim 8, wherein said ground VIA means interconnecting said spaced apart planes are positioned adjacent to corresponding signal VIA means.

10. A carrier apparatus in accordance with claim 5, wherein said coplanar ground leads are electrically interconnected by vertically extending VIA means to said underlying and overlying planes, said VIA means being positioned along said coplanar ground leads at frequent intervals.

11. A carrier apparatus in accordance with claim 5, wherein said ground VIA means cooperating with said signal VIA means to provide a transmission line environment along said signal VIA means are separate from and extend parallel to said signal VIA means.

12. A carrier apparatus in accordance with claim 5, wherein said ground VIA means and said signal VIA means cooperating with one another to provide a transmission line environment along said signal VIA means include a single elongated VIA structure having first and second electrically conducting portions electrically isolated from one another by a dielectric material.

13. A carrier apparatus in accordance with claim 5, wherein decoupling capacitors are positioned within cavities of said housing adjacent to said logic component cavity.

14. A carrier apparatus in accordance with claim 13, wherein said decoupling capacitors are symmetrically distributed throughout said housing.

15. A carrier apparatus for mounting logic components on the surface of a circuit board, comprising:

(a) a housing having first and second oppositely facing major surfaces and having a cavity extending from said first major surface into said housing for receipt of a logic component;

(b) lid means for enclosing said cavity;

(c) a plurality of alternating, spaced apart signal leads and ground leads arranged in a planar fashion, said signal leads including input and output signal leads extending from said cavity toward the periphery of said housing, said input signal leads having a lesser width than said output signal leads, whereby said input signal leads have a higher transmission line characteristic impedance than said output signal leads;

(d) means for electrically interconnecting said signal leads to corresponding leads on a circuit board;

(e) termination means positioned on the carrier apparatus for providing selective termination of said input signal leads with a matching impedance, said termination means including vertically extending VIA means embedded in said housing and surface metalization means disposed on said second major surface, said termination means being necessarily positioned on said housing in close electrical proximity to said logic component and necessarily accessible after the logic component has been positioned in said housing to enable selective termination of said signal leads with their characteristic impedance as required, thereby eliminating voltage reflection on said input signal leads; and (f) said signal leads and ground leads being positioned between spaced apart, planes selected from voltage and ground planes extending parallel to said signal leads and ground leads, said signal leads and said ground leads cooperating with said planes to provide a transmission line environment along said signal leads.

16. A carrier apparatus in accordance with claim 15, wherein said input signal leads include a termination resistor to provide termination of said input signal leads with a matching impedance, thereby eliminating voltage reflection or wavefronts on said input signal leads.

17. A carrier apparatus in accordance with claim 15, wherein the carrier apparatus includes mounting means for mounting the carrier apparatus on the circuit board with said lid means facing toward the circuit board such that the carrier apparatus is mounted in a lid down configuration.

18. A carrier apparatus in accordance with claim 15, wherein the carrier apparatus provides for cooling of the logic component with cooling means separate from and independent of the circuit board, whereby said cooling means is not integral with nor embedded in the circuit board.

19. A carrier apparatus in accordance with claim 18, wherein the carrier apparatus includes a metalized relatively flat region positioned on said second major surface of the carrier apparatus facing away from the circuit board.

20. A carrier apparatus in accordance with claim 5, wherein said vertically extending signal VIA means and said vertically extending ground VIA means include a single elongated, vertically extending VIA member of dielectric material having two outer separate, spaced apart metal layers each having a semicircular cross section, one of the metal layers being connected to a ground and the other being connected to one of the signal leads.

21. A carrier apparatus in accordance with claim 5, wherein said vertically extending VIA means and said vertically extending ground VIA means comprise spaced apart vertically extending, electrically conducting VIA members cooperating with each other to provide a transmission line environment.

* * * * *